United States Patent
Yu et al.

(10) Patent No.: US 12,174,424 B2
(45) Date of Patent: Dec. 24, 2024

(54) OPTOELECTRONIC DEVICE AND METHOD OF MANUFACTURE THEREOF

(71) Applicant: Chamartin Laboratories LLC, Wilmington, DE (US)

(72) Inventors: Guomin Yu, Glendora, CA (US); Aaron John Zilkie, Pasadena, CA (US)

(73) Assignee: CHAMARTIN LABORATORIES LLC, Wilmington, DE (US)

( * ) Notice: Subject to any disclaimer, the term of this patent is extended or adjusted under 35 U.S.C. 154(b) by 300 days.

(21) Appl. No.: 17/439,297

(22) PCT Filed: Nov. 12, 2020

(86) PCT No.: PCT/EP2020/081949
§ 371 (c)(1),
(2) Date: Sep. 14, 2021

(87) PCT Pub. No.: WO2021/094473
PCT Pub. Date: May 20, 2021

(65) Prior Publication Data
US 2022/0155521 A1    May 19, 2022

Related U.S. Application Data

(60) Provisional application No. 63/076,719, filed on Sep. 10, 2020, provisional application No. 63/075,645, filed on Sep. 8, 2020.

(30) Foreign Application Priority Data

Nov. 15, 2019    (GB) ..................... 1916700

(51) Int. Cl.
*G02B 6/13*    (2006.01)
*G02B 6/122*   (2006.01)
*G02B 6/124*   (2006.01)

(52) U.S. Cl.
CPC ............ *G02B 6/13* (2013.01); *G02B 6/1228* (2013.01); *G02B 6/124* (2013.01)

(58) Field of Classification Search
CPC ...... G02B 6/13; G02B 6/025; G02B 6/12004; G02B 6/1228; G02B 6/124; G02B 6/1223;
(Continued)

(56) References Cited

U.S. PATENT DOCUMENTS 5,163,118 A    11/1992  Lorenzo et al.
5,939,729 A *  8/1999   Chu .................... H01L 31/1035
                                                        257/23

(Continued)

FOREIGN PATENT DOCUMENTS

CN    102162137 A    8/2011
CN    105612612 A    5/2016
(Continued)

OTHER PUBLICATIONS

Hashimoto, Y. et al., "Fabrication of an Anti-Reflective and Super-Hydrophobic Structure by Vacuum Ultraviolet Light-Assisted Bonding and Nanoscale Pattern Transfer", Micromachines, Apr. 15, 2018, pp. 1-11, MDPI.
(Continued)

*Primary Examiner* — Ryan A Lepisto
*Assistant Examiner* — Erin D Chiem
(74) *Attorney, Agent, or Firm* — Brownstein Hyatt Farber Schreck, LLP

(57) ABSTRACT

A method of manufacturing an optoelectronic device. The manufactured device includes a photonic component coupled to a waveguide. The method comprising: providing a device coupon, the device coupon including the photonic component; providing a silicon platform, the silicon platform comprising a cavity within which is a bonding surface (Continued)

for the device coupon; transfer printing the device coupon onto the cavity, such that a surface of the device coupon directly abuts the bonding surface and at least one channel is present between the device coupon and a sidewall of the cavity; and filling the at least one channel with a filling material via a spin-coating process, to form a bridge coupling the III-V semiconductor based photonic component to the silicon waveguide.

19 Claims, 29 Drawing Sheets

(58) Field of Classification Search
    CPC .................. G02B 6/136; G02B 6/4253; G02B
                2006/12061; H01L 33/30; H01L 31/0232;
                H01L 31/0304; H01L 31/1892; H01S
                5/021; H01S 5/0265; H01S 5/50; H01S
                5/02218; H01S 5/026; G02F 1/025; G02F
                1/01708
    See application file for complete search history.

(56) References Cited

U.S. PATENT DOCUMENTS

| | | | |
|---|---|---|---|
| 6,154,475 | A | 11/2000 | Soref et al. |
| 6,222,951 | B1 | 4/2001 | Huang |
| 6,509,139 | B1 * | 1/2003 | Roberts ............... G02B 6/13 430/324 |
| 7,257,283 | B1 | 8/2007 | Liu et al. |
| 7,391,801 | B1 | 6/2008 | Soref et al. |
| 8,106,379 | B2 | 1/2012 | Bowers |
| 8,160,404 | B2 | 4/2012 | Pan et al. |
| 8,330,242 | B2 | 12/2012 | Shiba et al. |
| 8,710,470 | B2 | 4/2014 | Gattass et al. |
| 8,767,792 | B2 | 7/2014 | Bowers et al. |
| 8,768,132 | B2 | 7/2014 | Stewart et al. |
| 9,097,846 | B2 | 8/2015 | Mizrahi et al. |
| 9,134,553 | B2 | 9/2015 | Lim et al. |
| 9,209,142 | B1 | 12/2015 | Lambert et al. |
| 9,368,579 | B2 | 6/2016 | Balram et al. |
| 9,500,807 | B2 | 11/2016 | Oka |
| 9,513,498 | B2 | 12/2016 | Jones et al. |
| 9,768,195 | B2 | 9/2017 | Chou et al. |
| 9,922,967 | B2 | 3/2018 | Krasulick |
| 10,340,661 | B2 | 7/2019 | Caër et al. |
| 11,784,456 | B2 | 10/2023 | Yu |
| 2002/0172464 | A1 | 11/2002 | Delwala |
| 2003/0003734 | A1 | 1/2003 | Delwala |
| 2003/0003735 | A1 | 1/2003 | Deliwala |
| 2003/0003736 | A1 | 1/2003 | Delwala |
| 2003/0003737 | A1 | 1/2003 | Delwala |
| 2003/0003738 | A1 | 1/2003 | Delwala |
| 2004/0069984 | A1 | 4/2004 | Estes et al. |
| 2004/0207016 | A1 | 10/2004 | Patel et al. |
| 2004/0258347 | A1 | 12/2004 | Gothoskar et al. |
| 2005/0189591 | A1 | 9/2005 | Gothoskar et al. |
| 2005/0236619 | A1 | 10/2005 | Patel et al. |
| 2006/0177173 | A1 | 8/2006 | Shastri et al. |
| 2008/0073744 | A1 | 3/2008 | Masini et al. |
| 2008/0267239 | A1 | 10/2008 | Hall et al. |
| 2009/0016666 | A1 | 1/2009 | Kuo et al. |
| 2009/0245298 | A1 | 10/2009 | Sysak et al. |
| 2009/0324164 | A1 | 12/2009 | Reshotko et al. |
| 2010/0247021 | A1 | 9/2010 | Cunningham et al. |
| 2010/0247022 | A1 | 9/2010 | Li et al. |
| 2010/0247029 | A1 | 9/2010 | Li et al. |
| 2010/0330727 | A1 | 12/2010 | Hill et al. |
| 2011/0012221 | A1 | 1/2011 | Fujikata et al. |
| 2011/0170819 | A1 | 7/2011 | Zheng et al. |
| 2011/0215344 | A1 | 9/2011 | Dardy et al. |
| 2011/0299561 | A1 | 12/2011 | Akiyama |
| 2012/0001210 | A1 | 1/2012 | Mochizuki |
| 2012/0168816 | A1 | 7/2012 | Sweeney |
| 2012/0207424 | A1 | 8/2012 | Zheng et al. |
| 2012/0207479 | A1 | 8/2012 | Krishnamoorthy et al. |
| 2012/0219250 | A1 | 8/2012 | Ren et al. |
| 2012/0300796 | A1 | 11/2012 | Sysak et al. |
| 2013/0039664 | A1 | 2/2013 | Clifton et al. |
| 2013/0051727 | A1 | 2/2013 | Mizrahi et al. |
| 2013/0195137 | A1 | 8/2013 | Bowers et al. |
| 2013/0279845 | A1 | 10/2013 | Kobrinsky et al. |
| 2013/0285184 | A1 | 10/2013 | Li |
| 2013/0321816 | A1 | 12/2013 | Dattner et al. |
| 2014/0061677 | A1 | 3/2014 | Jakoby et al. |
| 2014/0204352 | A1 | 7/2014 | Mochizuki et al. |
| 2014/0270618 | A1 | 9/2014 | Dinu et al. |
| 2014/0307997 | A1 | 10/2014 | Bar et al. |
| 2014/0319656 | A1 | 10/2014 | Marchena et al. |
| 2014/0334768 | A1 * | 11/2014 | Chang .................. G02B 6/4204 438/27 |
| 2014/0338726 | A1 | 11/2014 | Nobori |
| 2015/0097210 | A1 | 4/2015 | Krasulick et al. |
| 2015/0098676 | A1 | 4/2015 | Krasulick et al. |
| 2015/0125111 | A1 | 5/2015 | Orcutt et al. |
| 2015/0270684 | A1 | 9/2015 | Suzuki et al. |
| 2016/0043262 | A1 | 2/2016 | Okumura |
| 2016/0087160 | A1 | 3/2016 | Cheng et al. |
| 2016/0109731 | A1 | 4/2016 | Huang |
| 2016/0111407 | A1 | 4/2016 | Krasulick |
| 2016/0211645 | A1 | 7/2016 | Padullaparthi |
| 2016/0246016 | A1 | 8/2016 | Mizrahi et al. |
| 2016/0274319 | A1 | 9/2016 | Krasulick et al. |
| 2016/0291248 | A1 | 10/2016 | HuangFu |
| 2016/0358954 | A1 | 12/2016 | Hoyos et al. |
| 2017/0207600 | A1 * | 7/2017 | Klamkin ................. H01S 5/142 |
| 2017/0229840 | A1 | 8/2017 | Lambert |
| 2017/0255077 | A1 | 9/2017 | Pruessner et al. |
| 2017/0317471 | A1 | 11/2017 | Lor et al. |
| 2018/0019139 | A1 | 1/2018 | Sun et al. |
| 2018/0081118 | A1 | 3/2018 | Klamkin et al. |
| 2018/0246351 | A1 | 8/2018 | Ho et al. |
| 2019/0140425 | A1 | 5/2019 | Hahn et al. |
| 2019/0179177 | A1 | 6/2019 | Rickman et al. |
| 2019/0377203 | A1 | 12/2019 | Yu et al. |
| 2019/0384003 | A1 | 12/2019 | Painchaud et al. |
| 2019/0384073 | A1 | 12/2019 | Yu et al. |
| 2020/0124878 | A1 | 4/2020 | Yu et al. |
| 2020/0363662 | A1 | 11/2020 | Yu et al. |
| 2021/0111301 | A1 | 4/2021 | Yu |
| 2022/0276438 | A1 | 9/2022 | Yu et al. |
| 2023/0090189 | A1 | 3/2023 | Yu et al. |

FOREIGN PATENT DOCUMENTS

| | | | |
|---|---|---|---|
| GB | 2573586 | A | 11/2019 |
| GB | 2577608 | A | 4/2020 |
| GB | 2586889 | A | 3/2021 |
| GB | 2589335 | A | 6/2021 |
| GB | 2592282 | A | 8/2021 |
| JP | 7-74396 | A | 3/1995 |
| JP | 2005-300678 | A | 10/2005 |
| JP | 2012-151327 | A | 8/2012 |
| JP | 2014-525608 | A | 9/2014 |
| JP | 2016-533027 | A | 10/2016 |
| WO | WO 2009/110632 | A1 | 9/2009 |
| WO | 2017/139350 | A1 | 8/2017 |
| WO | 2017/197132 | A1 | 11/2017 |
| WO | WO 2018/096038 | A1 | 5/2018 |
| WO | WO 2019/101369 | A1 | 5/2019 |
| WO | WO 2019/220207 | A1 | 11/2019 |
| WO | WO 2020/030641 | A1 | 2/2020 |
| WO | WO 2021/094473 | A1 | 5/2021 |

OTHER PUBLICATIONS

International Search Report and Written Opinion of the International Searching Authority, mailed Feb. 25, 2021, Corresponding to PCT/EP2020/081949, 14 pages.
Loi, R. et al., "Transfer Printing of AlGaInAs/InP Etched Facet Lasers to Si Substrates", IEEE Photonics Journal, Dec. 2016, 11 pages, vol. 8, No. 6, IEEE.

(56) References Cited

OTHER PUBLICATIONS

Roelkens, G. et al., "Transfer printing for silicon photonics transceivers and interposers", 2018, pp. 13-14, IEEE.

Ye, N. et al., "High-alignment-accuracy transfer printing of passive silicon waveguide structures", Optics Express, Jan. 18, 2018, pp. 2023-2032, vol. 26, No. 2, Optical Society of America.

Zhang, J. et al., "III-V-on-Si photonic integrated circuits realized using micro-transfer-printing", APL Photonics, Nov. 4, 2019, pp. 110803-1 through 110803-10, vol. 4.

U.K. Intellectual Property Office Search and Examination Report, dated Apr. 8, 2020, for Patent Application No. GB1916700.6, 6 pages.

U.K. Intellectual Property Office Search Report, dated Nov. 25, 2021, for Patent Application No. GB1916700.6, 6 pages.

U.K. Intellectual Property Office Search and Examination Report, dated Feb. 23, 2022, for Patent Application No. GB2118589.7, 5 pages.

European Communication pursuant to Article 94(3) EPC, for Patent Application No. 20 807 013.6, mailed Jul. 15, 2024, 4 pages.

Chinese Notification of the First Office Action, for Patent Application No. 201780038803.8, mailed Aug. 22, 2022, 8 pages.

Chinese Notification of the First Office Action, for Patent Application No. CN 201880002546.7, mailed Nov. 28, 2023, 8 pages.

Claussen, S.A. et al., "Selective area growth of germanium and germanium/silicon-germanium quantum wells in silicon waveguides for on-chip optical interconnect applications", Optical Materials Express, Oct. 1, 2012, pp. 1336-1342, vol. 2, No. 10, OSA.

European Patent Office Communication pursuant to Article 94(3) EPC, dated Jan. 4, 2022, for Patent Application No. GB 18 723 010.7, 5 pages.

International Search Report and Written Opinion of the International Searching Authority, Mailed Mar. 8, 2018, Corresponding to PCT/EP2017/080221, 13 pages.

International Search Report and Written Opinion of the International Searching Authority, Mailed Aug. 29, 2018, Corresponding to PCT/EP2018/062269, 15 pages.

International Search Report and Written Opinion of the International Searching Authority issued in PCT/IB2019/000565, Sep. 17, 2019, 13 pages.

International Search Report and Written Opinion of the International Searching Authority, mailed Jan. 30, 2023, corresponding to PCT/EP2022/076242, 14 pages.

International Search Report and Written Opinion of the International Searching Authority, Mailed Nov. 10, 2020, Corresponding to PCT/EP2020/073767, 16 pages.

Japanese Notification of Reasons for Refusal, for Patent Application No. 2020-528381, mailed Feb. 22, 2022, 5 pages.

Partial English translation of the Chinese Notification of the First Office Action, for Patent Application No. 201780038803.8, mailed Aug. 22, 2022, 16 pages.

Partial English translation of the Chinese Notification of the First Office Action, for Patent Application No. CN 201880002546.7, mailed Nov. 28, 2023, 13 pages.

Partial English translation of the Japanese Notification of Reasons for Refusal, for Patent Application No. 2020-528381, mailed Feb. 22, 2022, 5 pages.

Ren, S. et al., "Selective epitaxial growth of Ge/$Si_{0.15}Ge_{0.85}$ quantum wells on Si substrate using reduced pressure chemical vapor deposition", Applied Physics Letters, 2011, pp. 151108-1 through 151108-3, American Institute of Physics.

Ren, S., "Ge/SiGe Quantum Well Waveguide Modulator for Optical Interconnect Systems", Dissertation submitted to the department of electrical engineering and the committee on graduate studies of Stanford University in partial fulfillment of the requirements for the degree of doctor of philosophy, Mar. 2011, 138 pages.

Rouifed, Mohamed-Saïd et al., "Advances Toward Ge/SiGe Quantum-Well Waveguide Modulators at 1.3μm", IEEE Journal of Selected Topics in Quantum Electronics, 2013, 7 pages, vol. 20, No. 4, IEEE.

U.K. Intellectual Property Office Combined Search and Examination Report, Dated Sep. 27, 2018, for Patent Application No. GB1812309.1, 5 pages.

U.K. Intellectual Property Office Combined Search and Examination Report, Dated Sep. 27, 2018 and re-sent by Examiner Sep. 26, 2019, for Patent Application No. GB1812309.1, 7 pages.

U.K. Intellectual Property Office Combined Search and Examination Report, dated Feb. 17, 2020, for Patent Application No. GB1912499.9, 5 pages.

U.K. Intellectual Property Office Search and Examination Report, Dated Apr. 17, 2020, for Patent Application No. GB1915085.3, 5 pages.

U.K. Intellectual Property Office Search and Examination Report, dated Dec. 21, 2021, for Patent Application No. GB 1915085.3, 4 pages.

U.S. Notice of Allowance for U.S. Appl. No. 16/463,203, dated Aug. 31, 2020, 8 pages.

U.S. Office Action for U.S. Appl. No. 16/427,247, dated Apr. 15, 2020, 14 pages.

U.S. Office Action for U.S. Appl. No. 16/463,203, dated Apr. 16, 2020, 13 pages.

U.S. Office Action for U.S. Appl. No. 16/766,268, dated Feb. 2, 2021, 16 pages.

U.S. Office Action for U.S. Appl. No. 17/002,722, dated Nov. 8, 2022, 14 pages.

U.S. Office Action from U.S. Appl. No. 17/055,541, dated Dec. 11, 2023, 7 pages.

U.S. Office Action from U.S. Appl. No. 17/848,328, dated May 10, 2024, 28 pages.

U.S. Restriction Requirement including a list of references, from U.S. Appl. No. 17/055,541, dated Aug. 9, 2023, 9 pages.

U.S. Office Action from U.S. Appl. No. 17/748,639, dated Apr. 15, 2024, 12 pages.

* cited by examiner

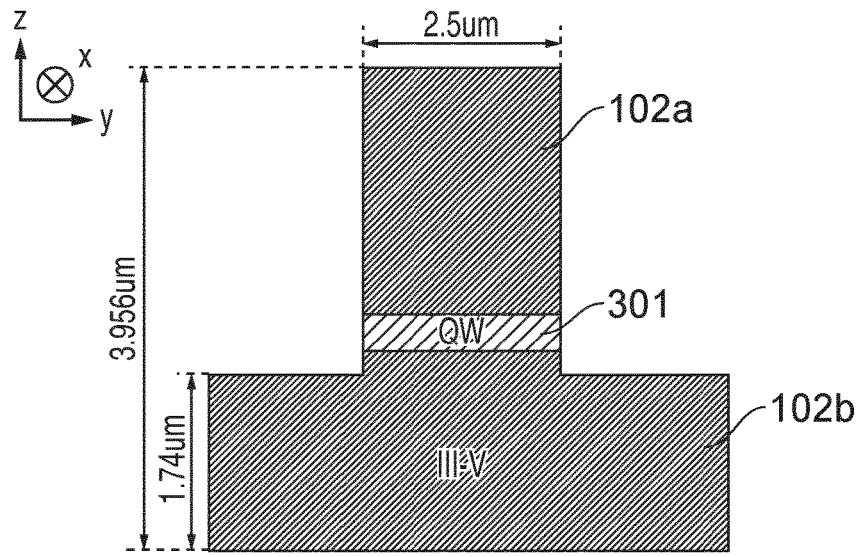
FIG. 3C
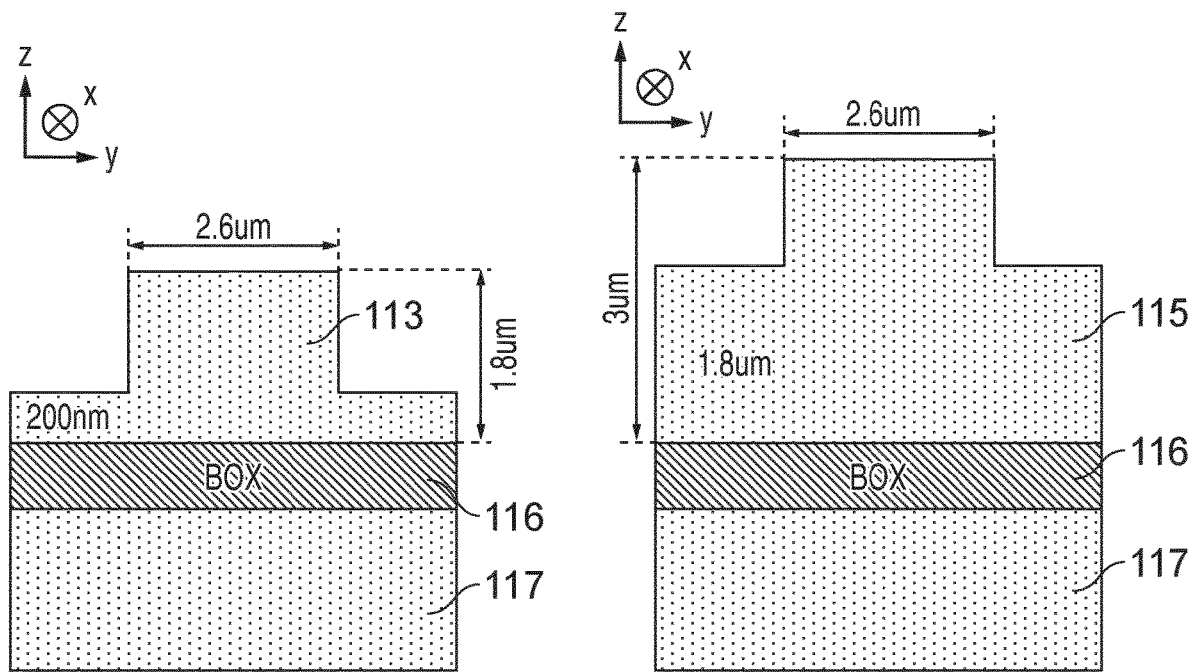
FIG. 3D
FIG. 3E 3D view of III-V/SOI waveguides

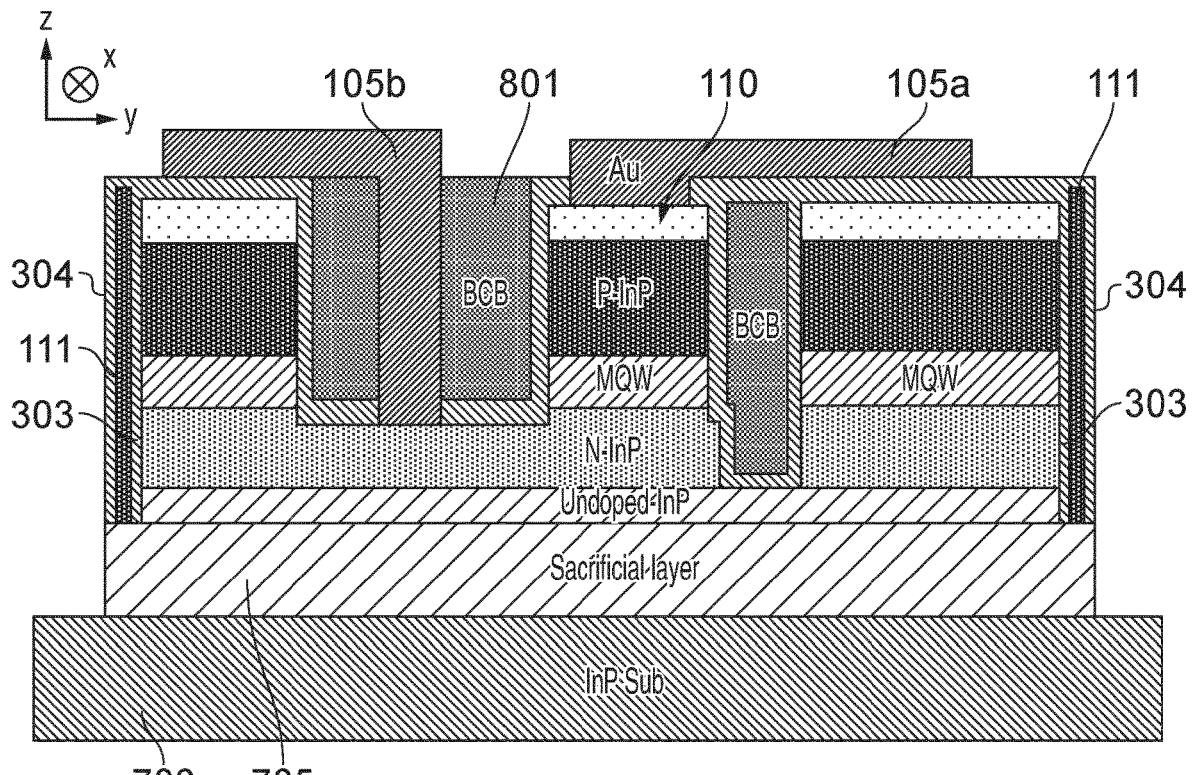
FIG. 7(iii)

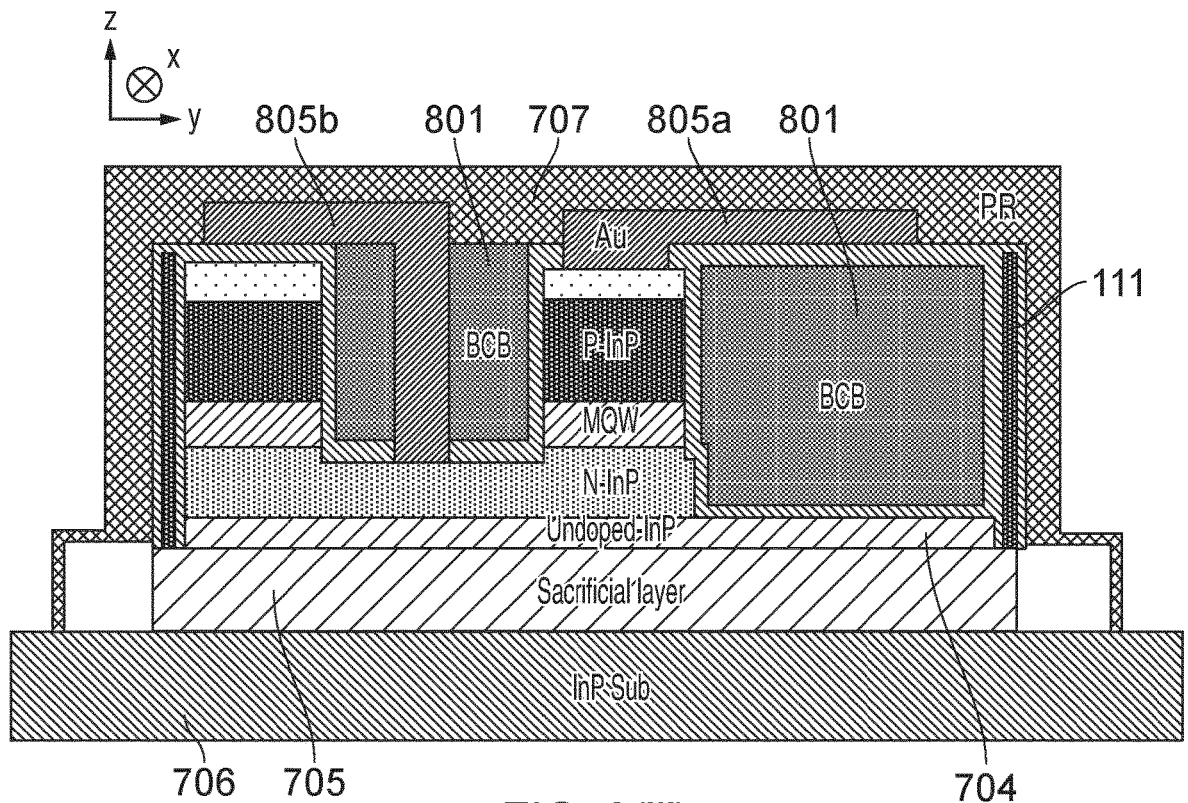
FIG. 8(iii)

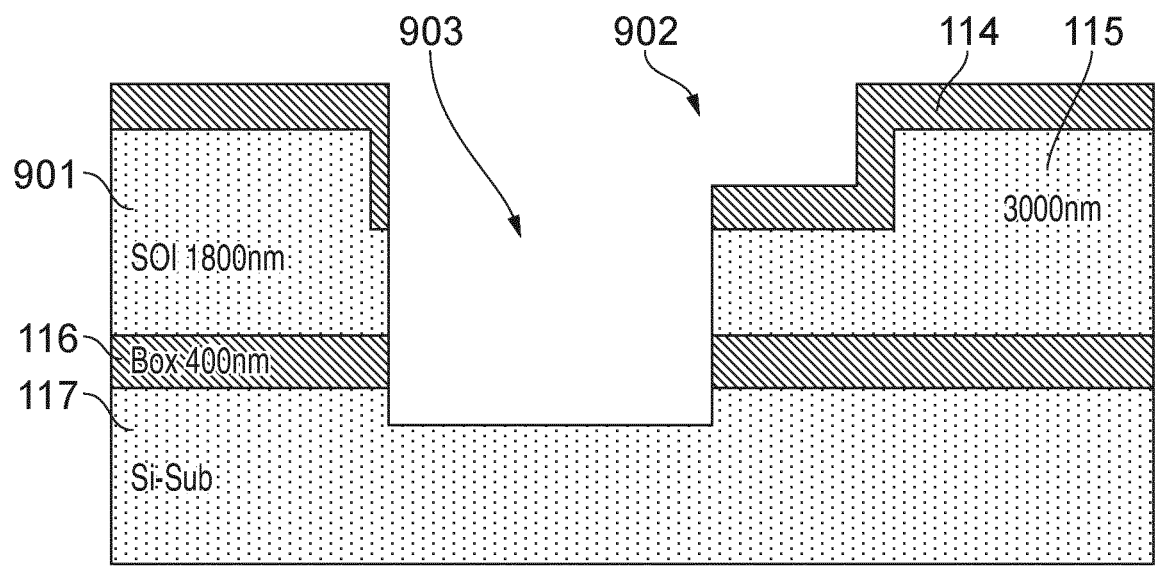
FIG. 9(iii)

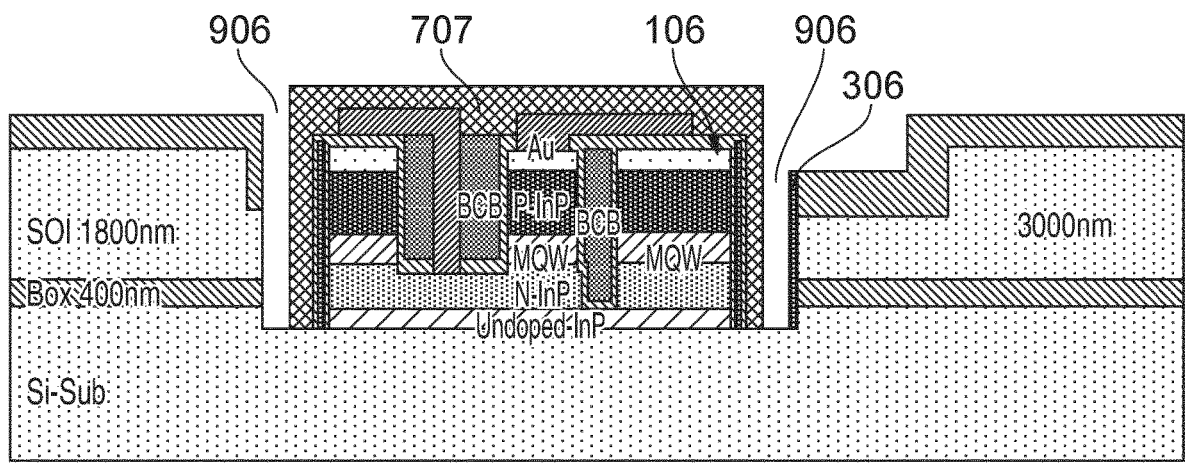
FIG. 10(iii)

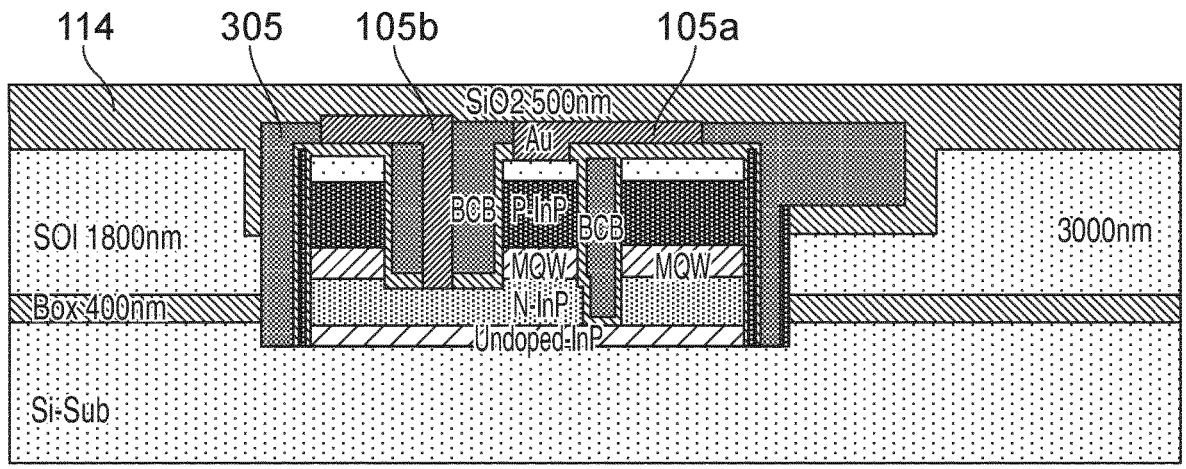
FIG. 10(vii)
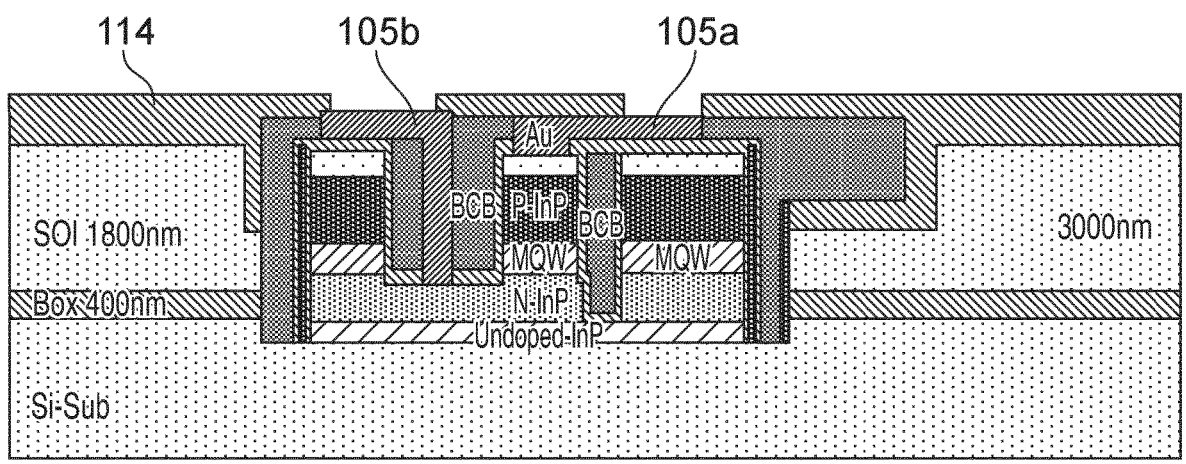
FIG. 10(viii)

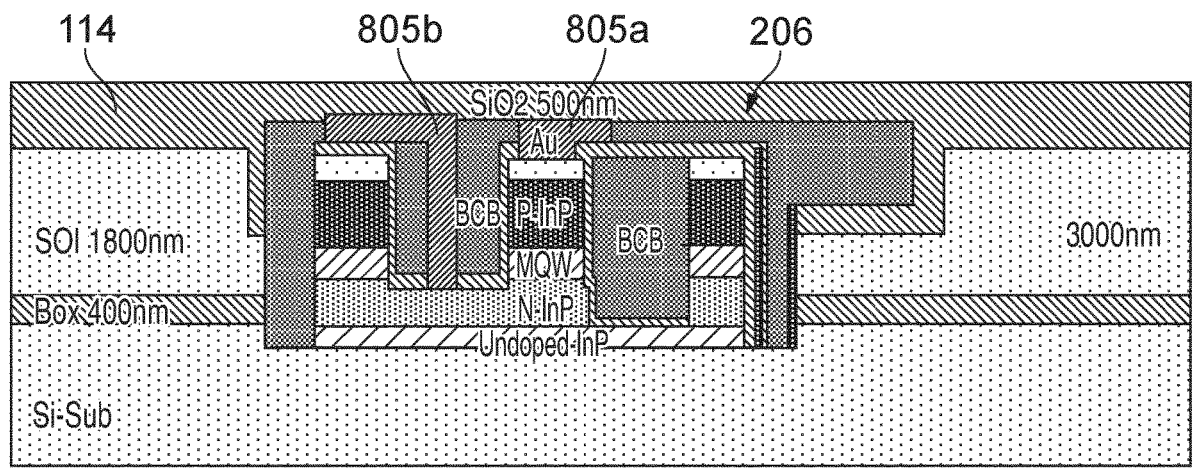
FIG. 11(iii)

OPTOELECTRONIC DEVICE AND METHOD OF MANUFACTURE THEREOF

CROSS-REFERENCE TO RELATED APPLICATION(S)

This application is a U.S. national stage entry, under 35 U.S.C. § 371, of International Application Number PCT/EP2020/081949, filed on Nov. 12, 2020, which claims priority to British Patent Application Number 1916700.6, filed Nov. 15, 2019, and claims priority to and the benefit of U.S. Provisional Patent Application No. 63/075,645, filed Sep. 8, 2020, and U.S. Provisional Patent Application No. 63/076,719, filed Sep. 10, 2020. The entire contents of all of the applications identified in this paragraph are incorporated herein by reference.

FIELD OF THE INVENTION

The present invention relates to an optoelectronic device and method of making the same.

BACKGROUND

Hybrid integration of III-V semiconductor based electro-optical devices, (e.g. modulators) with silicon-on-insulator (SOI) platforms by chip bonding confers the advantage of combining the best parts of both material systems.

However, conventional chip bonding processes typically use flip-chip bonding, in which the III-V semiconductor based device is upside down and bonded into a cavity on the SOI platform. Devices fabricated using these methods typically suffer from high optical coupling losses between a waveguide in the III-V semiconductor based device and a waveguide in the SOI. Further the manufacturing process has a low yield, and relatively low reliability because of difficulties in accurately controlling the alignment of the respective waveguides.

Micro-transfer printing (MTP) is therefore being looked into, as an alternative way to integrate III-V semiconductor based devices with SOI wafers. In these methods, the III-V semiconductor based device can be printed into a cavity on the SOI in the same orientation it was manufactured, and the alignment between the III-V semiconductor based waveguide and the SOI waveguide is pre-determined in the vertical direction (Z-direction). The requirements for alignment are therefore reduced from three dimensions to two, which can be more easily facilitated.

However, an issue with MTP arises from the gap that exists between the III-V semiconductor based waveguide and the SOI waveguide facets. Although the gap width can typically be well controlled (e.g. within the range 0.5 µm to 1.5 µm) it can cause the following issues: (i) a high optical coupling loss between the III-V semiconductor based waveguide and the SOI waveguide; and (ii) it leaves a gap in which particles, debris, or dirt may infiltrate, which can block the optical path, this reduces the device's long term reliability.

Therefore there is a need for a method of manufacturing an optoelectronic device, and the resultant optoelectronic device, which overcomes the shortcomings identified above.

SUMMARY

Accordingly, embodiments of a first aspect of the invention provide a method of manufacturing an optoelectronic device, the manufactured device including a photonic component coupled to a waveguide, the method comprising:
  providing a device coupon, the device coupon including the photonic component;
  providing a platform, the platform comprising a cavity within which is a bonding surface for the device coupon;
  transfer printing the device coupon onto the cavity, such that a surface of the device coupon directly abuts the bonding surface and at least one channel is present between the device coupon and a sidewall of the cavity; and
  filling the at least one channel with a filling material via a spin-coating process, to form a bridge coupling the photonic component to the waveguide.

The method uses simple fabrication processes, and the method is suitable for volume production. Moreover, the resulting devices demonstrate reduced levels of optical loss.

The method may have any one or, to the extent that they are compatible, any combination of the following optional features.

The photonic component may be a III-V semiconductor based photonic component, that is the photonic component may be made of III-V materials. The waveguide may be a silicon waveguide. The platform may be a silicon platform. The waveguide may be a silicon nitride waveguide.

The photonic component may be a II-VI or group IV based photonic component in that it may be made of II-VI or group IV materials. The photonic component may include a bulk semiconductor layer, a quantum well layer, a quantum dot layer, and a quantum dash layer, or any combination thereof, all with or without a Bragg grating. The Bragg grating may be located above or below (in a direction perpendicular to a substrate) the quantum well, quantum dot, or quantum dash layer.

The quantum well layer may comprise regular (e.g. rectangular) quantum wells or triangular quantum wells. The regular quantum wells have a flat energy band in each quantum well conduction band and valence band, and the triangular quantum wells have a V shape energy band in each quantum well conduction band and an inverted V shape in each quantum well valence band.

The photonic component may be any one of: an electro-absorption modulator; a laser; a photodetector; a semiconductor optical amplifier. The device coupon may include two or more photonic components, and may include any combination of the photonic components listed above. For example the device coupon may include a laser and an electro-absorption modulator; a laser, an electro-absorption modulator, and a semiconductor optical amplifier; or a laser, an electro-absorption modulator, a semiconductor optical amplifier, and a photodetector. The photonic component may be configured to function as a gain chip for a laser, as a photodetector, as an electro-absorption modulator, or as a phase modulator.

The waveguide, which is located on the platform, may include a waveguide grating. The waveguide grating may be a silicon waveguide grating, or a silicon nitride waveguide grating. The grating may be a Bragg grating.

The platform may include one or more passive devices, coupled to the waveguide. The passive device may be one of: an arrayed waveguide grating; an Echelle grating; a Mach-Zehnder interferometer; a multimode interferometer; a ring resonator; and a directional coupler.

The combination of the photonic component and waveguide may provide a distributed-feedback (DFB) laser, or distributed Bragg reflector (DBR) laser. When the combination results in a DFB laser, the photonic component may be a gain coupon with a Bragg grating, and be coupled to any of the following types of waveguide:
- passive silicon waveguide;
- functional silicon waveguide device coupled to a passive silicon waveguide;
- a passive silicon nitride (e.g. $Si_3N_4$) waveguide;
- a functional silicon nitride waveguide device coupled to a passive silicon nitride waveguide;
- a passive silicon nitride coupled to a silicon waveguide; and
- a functional silicon nitride waveguide device coupled to a passive silicon nitride waveguide which is coupled to a passive silicon waveguide.

When the combination results in a DBR laser, the photonic component may be a gain coupon and may be coupled to any of the following:
- a silicon waveguide grating coupled to a passive silicon waveguide;
- a silicon waveguide grating coupled to a functional silicon waveguide device which is coupled to a passive silicon waveguide;
- a silicon nitride waveguide grating coupled to a passive silicon nitride waveguide;
- a silicon nitride waveguide grating coupled to a functional silicon nitride waveguide device which is coupled to a passive silicon nitride waveguide;
- a silicon nitride waveguide grating coupled to a passive silicon nitride waveguide which is coupled to a passive silicon waveguide;
- and a silicon nitride waveguide grating coupled to a functional silicon nitride waveguide device which is coupled to a passive silicon nitride waveguide which is in turn coupled to a passive silicon waveguide.

The photonic component may be an electro-absorption modulator, and be coupled to any of the following:
- a functional silicon waveguide device which is coupled to a silicon waveguide;
- a passive silicon nitride waveguide;
- a passive silicon nitride waveguide coupled to a passive silicon waveguide;
- a functional silicon nitride waveguide device coupled to a passive silicon nitride waveguide; and
- a functional silicon nitride waveguide device coupled to a passive silicon nitride waveguide which is coupled to a passive silicon waveguide.

The photonic component may be a photodetector, and may be coupled to any of the following:
- a passive silicon waveguide;
- a functional silicon waveguide device coupled to a passive silicon waveguide;
- a passive silicon nitride waveguide;
- a functional silicon nitride waveguide device coupled to a passive silicon nitride waveguide;
- a passive silicon nitride waveguide coupled to a passive silicon waveguide; and
- a functional silicon nitride waveguide device coupled to a passive silicon nitride waveguide which is coupled to a passive silicon waveguide.

The photonic component may be a phase modulator, and may form a part of a silicon or silicon nitride waveguide forming an arm of a Mach-Zehnder interferometer.

A passive waveguide may comprise a straight segment, or a curved segment, or a combination of a straight segment and a curved segment.

By functional waveguide device, it may be meant that the waveguide contains an active device, in some examples the waveguide contains one or more of: a gain medium for a laser; a photodetector; an electro-absorption modulator; or a phase modulator.

The photonic component may include a waveguide. One or more photonic components may be integrated into the waveguide. The waveguide may be a III-V semiconductor based waveguide The bridge may not be waveguide, in that it may not function so as to confine an optical mode within the bridge structure.

The method may include a step of curing the filling material after it has been spun coated. For example, the filling material may be cured by UV or thermal curing.

The device coupon may include a first and second electrode. As such, the photonic component can be tested and characterised before it is bonded to the silicon platform. Correspondingly, the yield of the method may be higher as malfunctioning or poorly fabricated device coupons are not used (and so silicon platforms are preserved).

A silicon waveguide may be in a device layer of a silicon-on-insulator wafer provided in the platform, and the silicon waveguide may directly abut the cavity.

The silicon waveguide may include a waveguide tapering in height in a direction towards the cavity, from a first height to a second height, the first height being greater than the second height. Accordingly, the height of the silicon waveguide may decrease as it approaches the cavity. The resulting taper may function as a mode converter, between an optical mode within the III-V semiconductor based photonic component and an output waveguide of the resulting optoelectronic device.

The silicon waveguide may include a T-bar end portion, positioned adjacent to the cavity.

The photonic component may include a U-shaped waveguide, and the platform may include two waveguides, each coupled to a respective leg of the U-shaped waveguide. As such, the input and output waveguides of the optoelectronic device may be provided on a same side of the device.

The method may include a step, before filling the channel, of lining one or more sidewalls of the cavity with an anti-reflective liner.

The method may include a step, before transfer printing the device coupon, of providing an anti-reflective coating around one or more lateral side of the device coupon. The anti-reflective coating can serve to protect the lateral sides of the device coupon during the transfer printing process.

The method may include a step, after filling the channel, of covering the channel with a cladding layer. This isolates the filling material from moisture, which makes the resulting device more reliable. The cladding layer is, in some embodiments, silicon dioxide.

The method may include a step, after transfer printing the device coupon into the cavity, of providing electrode contact pads on the silicon platform, and electrically connecting them to the component. The resulting device has a reduction in parasitic capacitance, and so may operate faster.

The method may include a step, before transfer printing the device coupon, of providing an adhesive layer which forms the bonding surface of the cavity.

The method may include a step, after transfer printing the device coupon, of annealing the device coupon and silicon-on-insulator wafer.

The photonic component may include a waveguide including a T-bar end portion which, when printed into the cavity, may be positioned adjacent to the channel. The waveguide may be a III-V semiconductor based waveguide.

The filling material may be a polymer. For example, the filling material may be Benzocyclobutene. In other embodiments the filling material is a sol-gel.

In a second aspect, embodiments of the present invention provide an optoelectronic device, including:
  a waveguide, provided in a device layer of a wafer;
  a photonic component, located within a cavity of the wafer; and
  a bridge, which optically couples the waveguide to the photonic component;
  wherein the bridge is at least partially formed of a polymer.

Such an optoelectronic device has been found to have decreased optical loss between the silicon waveguide and the III-V semiconductor based photonic component.

The optoelectronic device may have any one or, to the extent that they are compatible, any combination of the following optional features.

The bridge may not be waveguide, in that it may not function so as to confine an optical mode within the bridge structure.

The bridge may also include one or more anti-reflective coatings. The bridge may include a pair of anti-reflective coatings, located on opposing sides of the polymer. One of the pair of anti-reflective coatings is formed of a layer of silicon nitride located between a pair of silicon dioxide layers.

The bridge may be covered by a passivation layer. This isolates the bridge from moisture, which makes the resulting device more reliable. The passivation layer is, in some embodiments, silicon dioxide.

The polymer may be Benzocyclobutene. The polymer may be sol-gel.

In a third aspect, embodiments of the present invention provide a method of manufacturing a device coupon, suitable for use in a transfer printing process, having the steps of:
  growing a multi-layered stack on a substrate, comprising one or more optically active layers;
  fabricating one or more photonic components from the multi-layered stack; and
  coating one or more lateral sides of the photonic component(s) with an anti-reflective coating.

Advantageously, the anti-reflective coating serves to: (i) reduce the optical losses when the device coupon is printed to a platform; (ii) protect the photonic component during the printing process; (iii) enhance device long term reliability.

The optically active layers may be III-V semiconductor based optically active layers. The photonic components may be III-V semiconductor based photonic components.

The method may further comprise a step of: coating one or more lateral sides of the photonic component with an anti-reflective coating.

The method may further comprise a step of providing a first electrode and a second electrode which electrically connect to respective layers of the multi-layered stack.

Advantageously, this allows the components to be tested and characterised before they are printed on a platform.

The method may include depositing one or more tethers onto the photonic component, and removing a sacrificial layer of the component between the photonic component and a substrate.

In a fourth aspect, embodiments of the present invention provide a device coupon, for use in a transfer printing process, comprising:
  a one or more photonic components; and
  an anti-reflective coating, located on one or more lateral sides of the photonic component.

Advantageously, the anti-reflective coating serves: (i) reduce the optical losses when the device coupon is printed to a platform; (ii) protect the photonic component during the printing process; (iii) enhance device long term reliability.

The photonic component(s) may be III-V semiconductor based photonic components.

The device may further comprise a first electrode and a second electrode, electrically connected to the photonic component. Advantageously, this allows the components to be tested and characterised before they are printed on a platform. The photonic component may include a waveguide. The waveguide may be a III-V semiconductor based waveguide.

In a fifth aspect, embodiments of the present invention provide an optoelectronic device manufactured using the method of the first aspect and including any one, or any combination insofar as they are compatible, of the optional features set out with reference thereto.

In a sixth aspect, embodiments of the present invention provide a device coupon manufactured using the method of the third aspect of the invention and including any one, or any combination insofar as they are compatible, of the optional features set out with reference thereto.

Further aspects of the present invention provide: a computer program comprising code which, when run on a computer, causes the computer to perform the method of the first and third aspects; a computer readable medium storing a computer program comprising code which, when run on a computer, causes the computer to perform the method of the first and third aspects; and a computer system programmed to perform the method of the first and third aspects.

BRIEF DESCRIPTION OF THE DRAWINGS

Embodiments of the invention will now be described by way of example with reference to the accompanying drawings in which:

FIG. 3A-3E show, respectively, a top-down view and sections view of a III-V waveguide and SOI waveguide interface according to embodiments of the present invention;

DETAILED DESCRIPTION AND FURTHER OPTIONAL FEATURES

Aspects and embodiments of the present invention will now be discussed with reference to the accompanying figures. Further aspects and embodiments will be apparent to those skilled in the art.

Figure 1A:
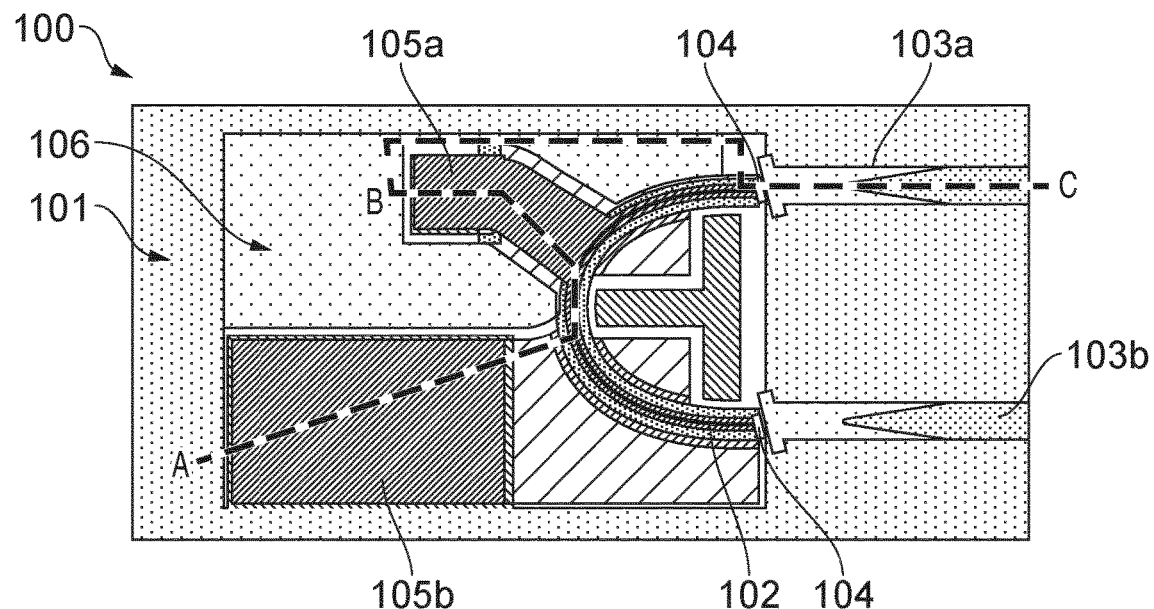
FIGS. 1A and 1B show, respectively, a top-down and section view of an optoelectronic device according to an embodiment of the present invention.
Figure 1B:
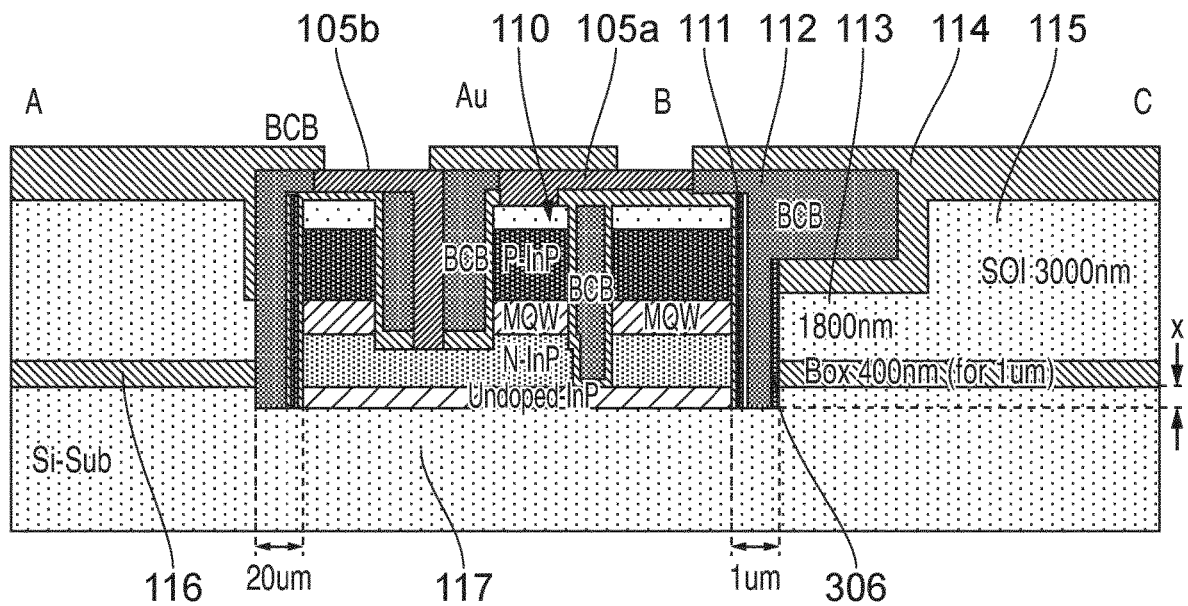

FIGS. 1A and 1B show, respectively, a top-down and section view of an optoelectronic device according to an embodiment of the present invention. As can be seen in FIG. 1A, the optoelectronic device 100 broadly comprises a silicon platform 101, containing silicon waveguides 103a and 103b. The silicon waveguides function as input and output waveguides to the device. Each silicon waveguide is coupled at respective interfaces 104 to a III-V semiconductor based waveguide 102 which is within III-V device coupon 106. The coupon having been bonded to the silicon platform. The III-V semiconductor based waveguide 102 is, in this example, U-shaped and so allows for connection to the silicon waveguides 103a and 103b on a same side of the device coupon 106.

The device coupon 106 also includes a first 105a and second 105b electrical contact pads or electrodes. The electrical contact pads connect to different layers of a III-V semiconductor based device 110 in the III-V semiconductor based waveguide and, in use, are connected to a driver which operates the device. This operation may be performed at RF frequencies.

FIG. 1B is a section view of the device 100 along the line A-B-C shown inn FIG. 1A. The section view shows the III-V semiconductor based device 110 in more detail, and also shows the cladding layer 114 omitted from FIG. 1A for reasons of clarity. The cladding layer is, in this example, formed of silicon dioxide ($SiO_2$). The cross-sectional structure of the silicon platform 101 is shown in more detail: a silicon substrate 117 is partially covered by a buried oxide layer 116, atop which are the silicon waveguides 103a and 103b.

Figure 7I:
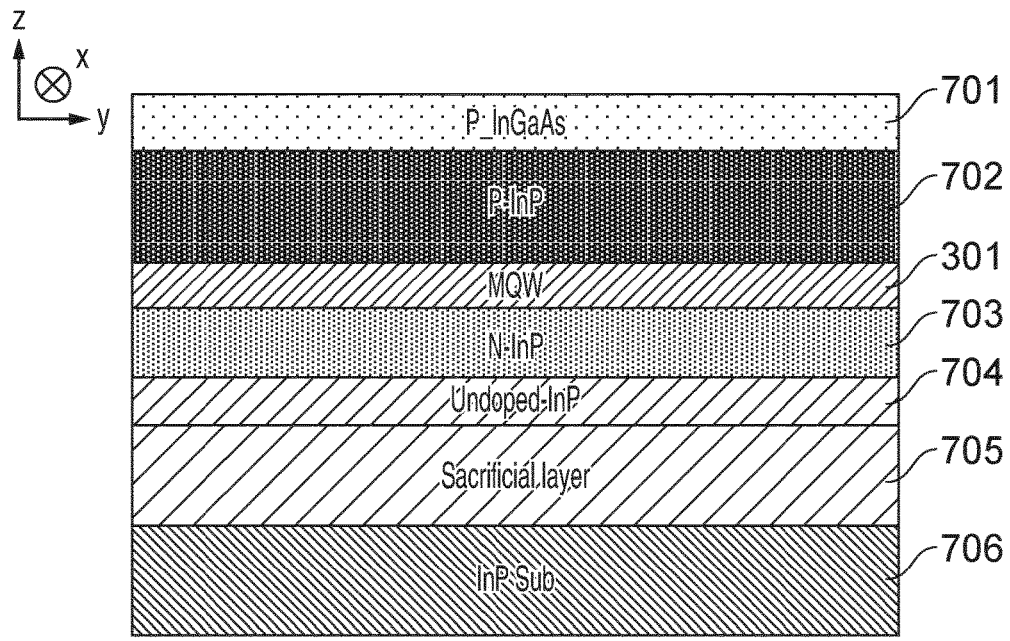
FIGS. 7(i) to 7(vi) show various manufacturing stages of a device coupon according to an embodiment of the present invention.

The plurality of layers forming the III-V semiconductor based device 110 can also be seen, the detail of which are discussed in detail with relation to FIG. 7(i). The nature of interface 104 is also shown in more detail, and comprises: anti-reflective coating 111 and 306 and bridge fill 112. The anti-reflective coatings are provided on the device coupon 106, as well as the silicon platform 101. The space between the anti-reflective coatings is filled by bridge fill 112 which is formed of a polymer. More detail relating to the interface 104 is shown in and discussed with relation to FIGS. 3B, 4A, 4B, and 5 respectively.

The anti-reflective coating 111 on the silicon platform 101 enhances the coupling from the III-V semiconductor based waveguide 102 into a 1800 nm section 113 of the silicon waveguide 103a. This 1800 nm section tapers to a 3000 nm section 115 for transmission to or from the device 100. In an example then where silicon waveguide 103a is the input waveguide, an optical signal is received into the 3000 nm section 115, and is converted to a mode confined within the 1800 nm section 113 before transmission into the III-V semiconductor based waveguide 104.

As can be seen in FIG. 1B, a gap exists between the silicon platform and the device coupon which has been filled by bridge fill 112, in this example Benzocyclobutene (BCB). The thickness of the gap varies as a function of position along the perimeter of the device coupon 106. At positions distal to the interfaces 104, the gap can be as wide as 20 μm as shown in FIG. 1B. Whereas, at positions proximal to and including the interfaces 104, the gap may be as narrow as (or narrower than) 1 μm. In this example, a height, x, from the bottommost portion of the bridge fill 112 to a bottommost portion of the buried oxide layer is around 810 nm (the buried oxide layer having a height of around 400 nm). Where the buried oxide layer has a height of around 1 μm, the height x may be around 210 nm.

Figure 2A:
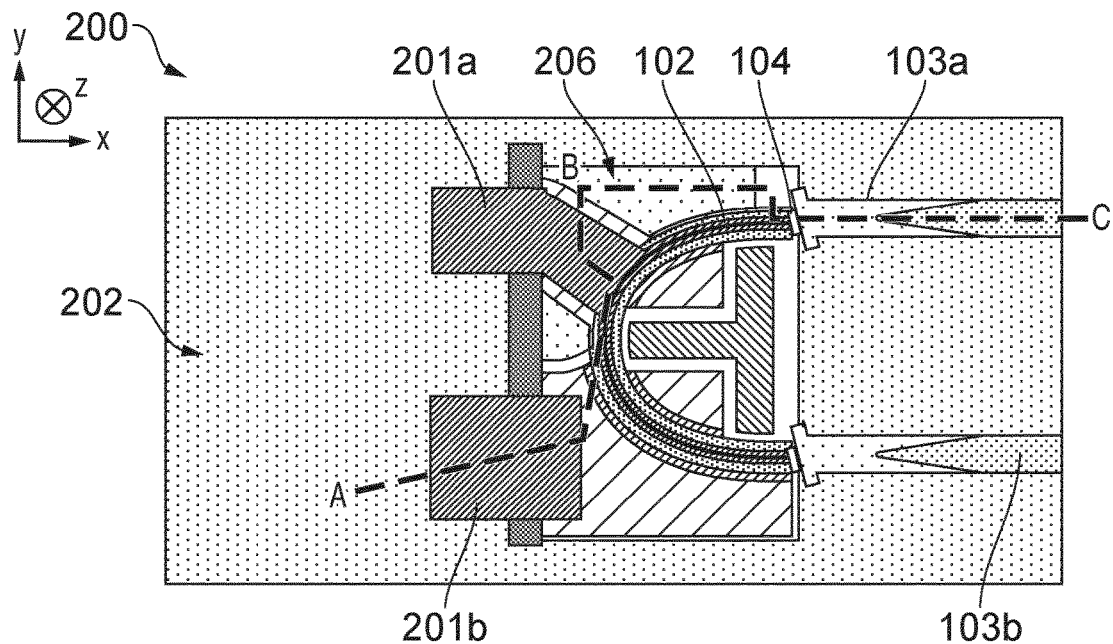
FIGS. 2A and 2B show, respectively, a top-down and section view of a variant optoelectronic device according to an embodiment of the present invention.
Figure 2B:
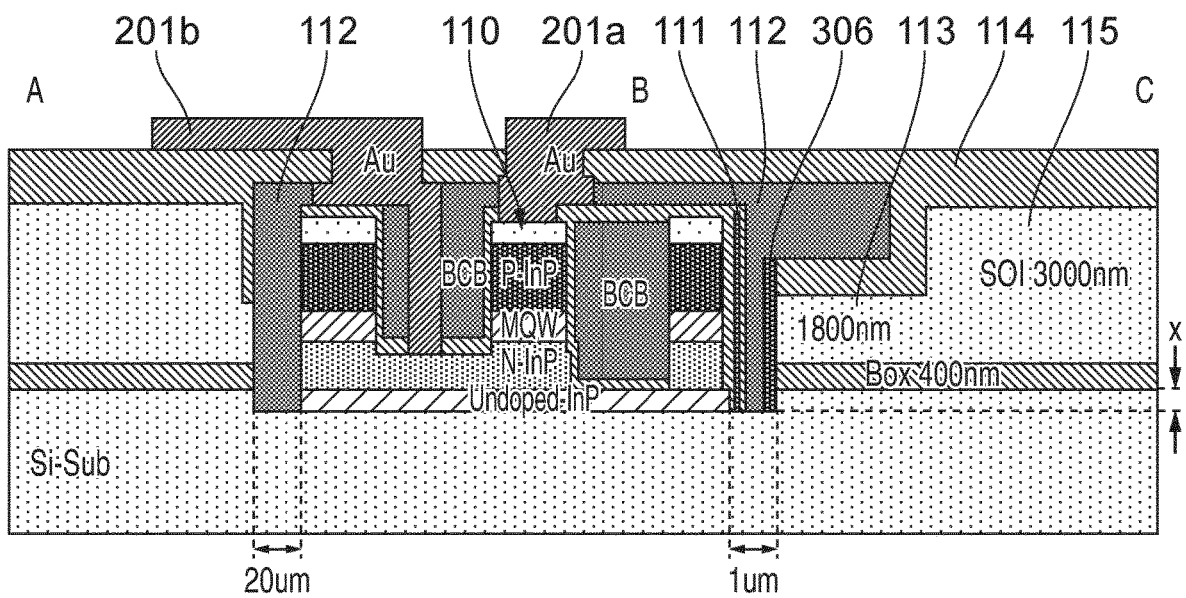

FIGS. 2A and 2B show, respectively, a top-down and section view of a variant optoelectronic device 200 according to an embodiment of the present invention. Where this embodiment shares features with the device 100 discussed above, like features are indicated by like reference numerals. The device 200 in FIGS. 2A and 2B chiefly differs from the earlier device in that contact pads 201a and 201b extend across the device coupon 206 to the silicon platform 202. This has the advantage that a smaller parasitic capacitance is experienced in use, and so the device speed is enhanced.

Figure 3A:
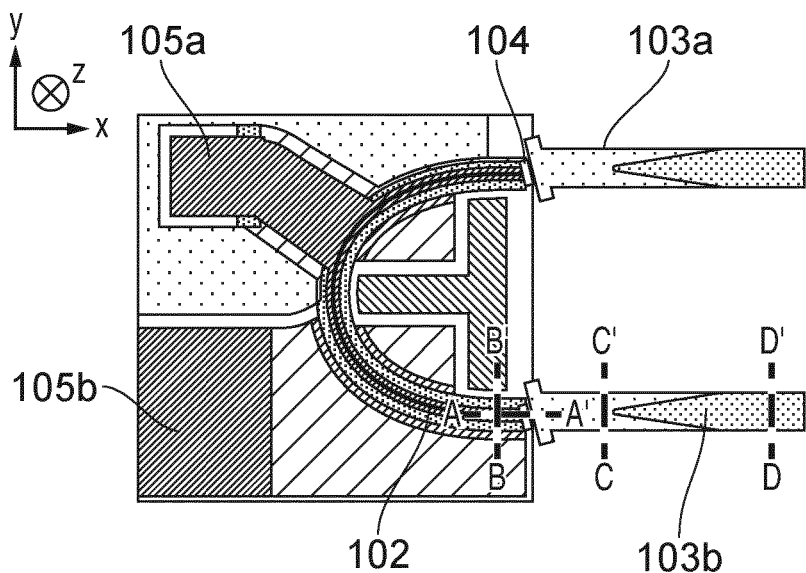
Figure 3B:
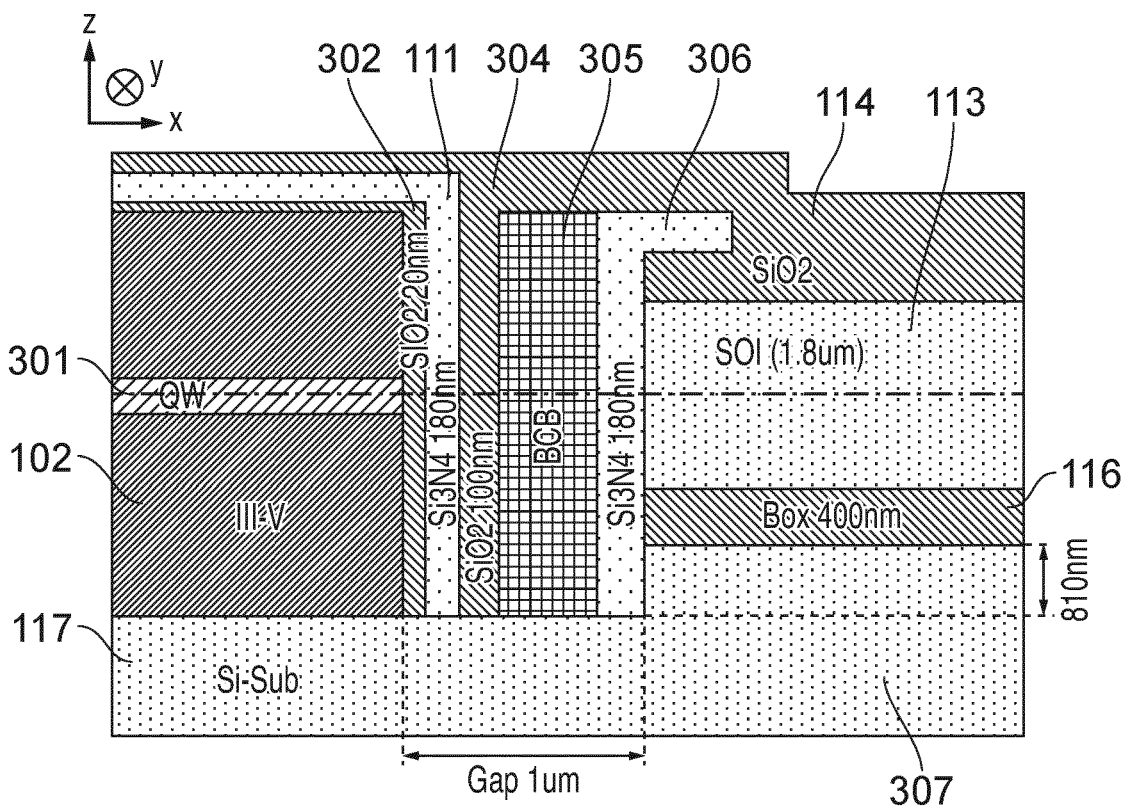

FIG. 3A-3E show, respectively, a top-down view and sections view of a III-V waveguide and SOI waveguide interface according to embodiments of the present invention. Whilst the example shown in FIG. 3A, a top-down view, is device 100, the interface shown has the same structure when implemented in device 200. FIG. 3B is a section view along the line A-A', FIG. 3C is a section view along the line B-B', FIG. 3D is a section view along the line C-C'; and FIG. 3E is a section view along the line D-D'.

In FIG. 3B, light is guided along the 'x' direction either from the 1.8 μm silicon waveguide 113 into the III-V semiconductor waveguide 102 or vice versa. As can be seen, the gap between the III-V semiconductor waveguide 102 and the 1.8 μm silicon waveguide has the following structure, in layers along the 'x' direction: 20 nm silicon dioxide layer 302; 180 nm anti-reflective silicon nitride, $Si_3N_4$, layer 111; 100 nm silicon dioxide layer 304; BCB fill 305; and 180 nm anti-reflective silicon nitride, $Si_3N_4$, layer 306. The 20 nm silicon dioxide layer 302 has a refractive index of around 1.45. The silicon nitride layer 111 has a refractive index of around 1.995, and the 100 nm silicon dioxide layer 304 has a refractive index of around 1.45. The 180 nm $Si_3N_4$ layer 306 has a refractive index of around 2.28 and, in this embodiment, with a composition slightly different to layer $Si_3N_4$ layer 111. However, the refractive index of the $Si_3N_4$ layers, 111 and 306, can be the same, either 1.995 or 2.28 with slight adjustment to their thickness. The entire gap has a width of around 1 μm. The entire anti-reflective coating, formed of layers 302, 111, 304, and 306 has a thickness of around 480 nm. The BCB fill has a refractive index of around 1.56. All of these refractive indexes are quoted for light at a wavelength of around 1310 nm.

The combination of these layers, in this fashion, have been found to enhance the coupling efficiency from the III-V semiconductor waveguide 102 to the 1.8 µm silicon waveguide 113.

Also shown in this view is silicon substrate portion 307, which extends part way up the cavity within which the device coupon sits. The height of this portion is around 810 nm. An optically active layer 301 of the III-V semiconductor based waveguide 102 can also be seen, in this example a multiple quantum well.

FIG. 3C is a cross-section along the line B-B' in FIG. 3A. The structure of the III-V semiconductor based waveguide 102 can be seen in greater detail. Broadly, the waveguide includes a waveguide slab or base 102b, and a ridge or rib 102 extending therefrom. Between the slab and rib, or forming a part of the rib, is the optically active layer 301. The slab, in this example, has a height of around 1.74 µm, whereas the rib has a height of around 3.956 µm. The rib has a width of around 2.5 µm.

FIG. 3D is a cross-section along the line C-C' in FIG. 3A. The structure of the 1.8 µm silicon waveguide 113 can be seen in greater detail. Broadly, the waveguide includes a slab or base, and a ridge or rib. The slab is around 200 nm tall, whereas the rib is around 1.8 µm tall and around 2.6 µm wide. FIG. 3E is a cross-section along the line D-D' in FIG. 3A. The structure of the 3 µm silicon waveguide 115 can be seen in greater detail. Broadly, the waveguide includes a slab or base and a ridge or rib. The slab is around 1.8 µm tall, whereas the rib is around 3 µm tall and around 2.6 µm wide. Herein, the height of a feature is typically measured from an uppermost surface of the buried oxide layer 116 to an uppermost surface of that feature. The height of the rib and slab in the 1.8 µm waveguide 113 tapers to the height in the 3 µm waveguide, such that the tapered region functions as a mode converter between the 1.8 µm waveguide and 3 µm waveguide.

Figure 4A:
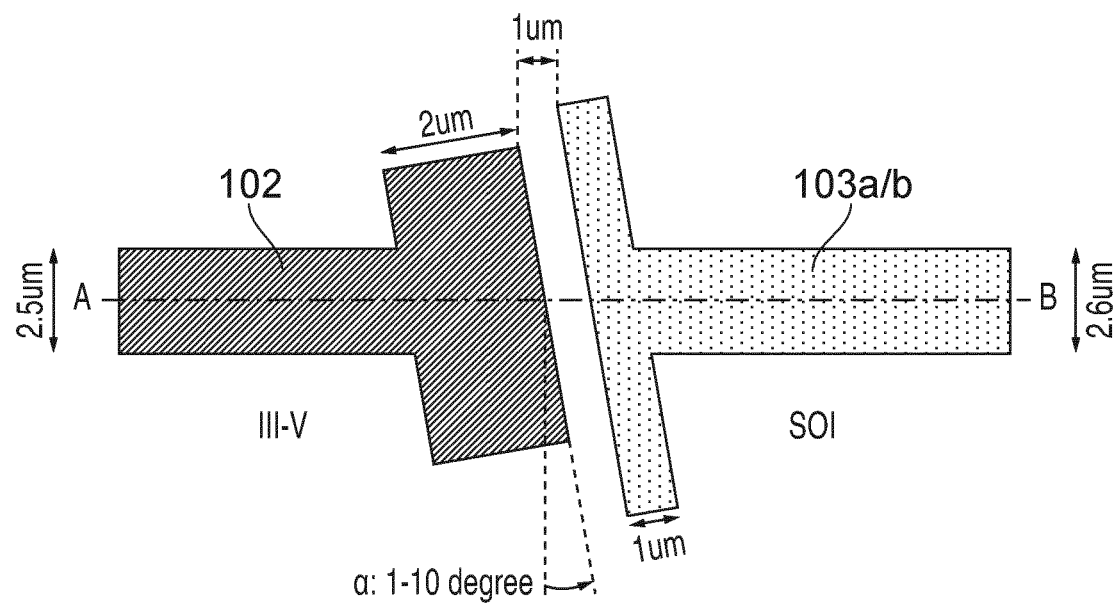
FIGS. 4A and 4B show schematic views of variant interfaces.
Figure 4B:
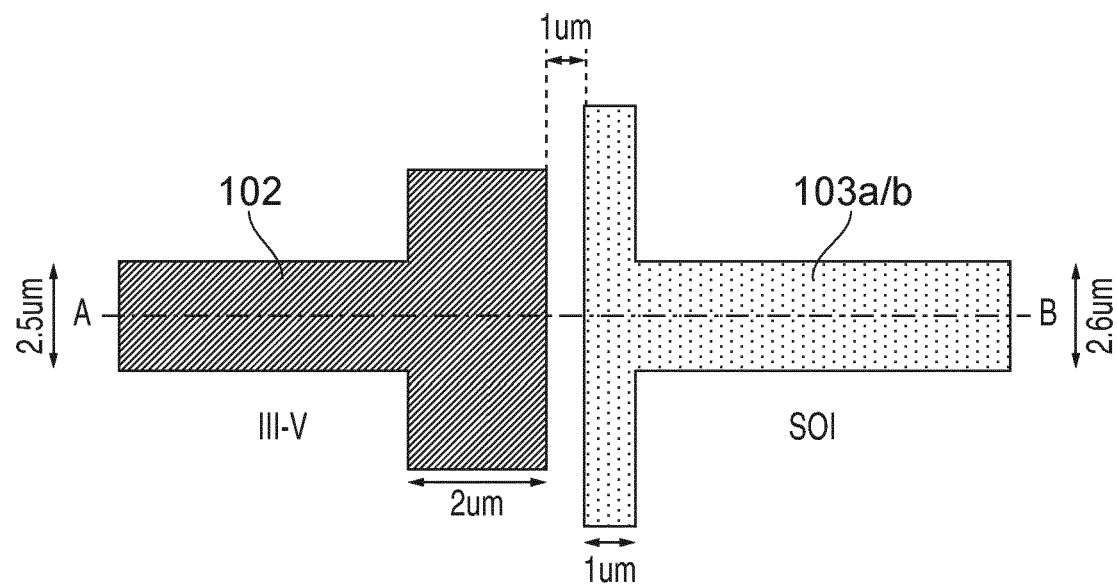

FIGS. 4A and 4B show schematic views top-down views of variant interfaces. In the example shown in FIG. 4A, which is the interface implemented in FIGS. 1A and 2A, the interface between the III-V semiconductor based waveguide 102 and the silicon waveguides 103a/b is at an angle α relative to the guiding direction (A-B, or vice versa). The angle α typically takes a value of between 1° and 10° inclusive. Also shown in FIG. 4A is the 'T' geometry of the interfaces. The 'bar' of the T in the III-V semiconductor waveguide, i.e. the portion which extends at the angle α, has a width of around 2 µm. The 'bar' of the T in the silicon waveguide, again the portion which extends at the angle α, has a width of around 1 µm. A gap between the respective T interfaces is around 1 µm.

Figure 5:
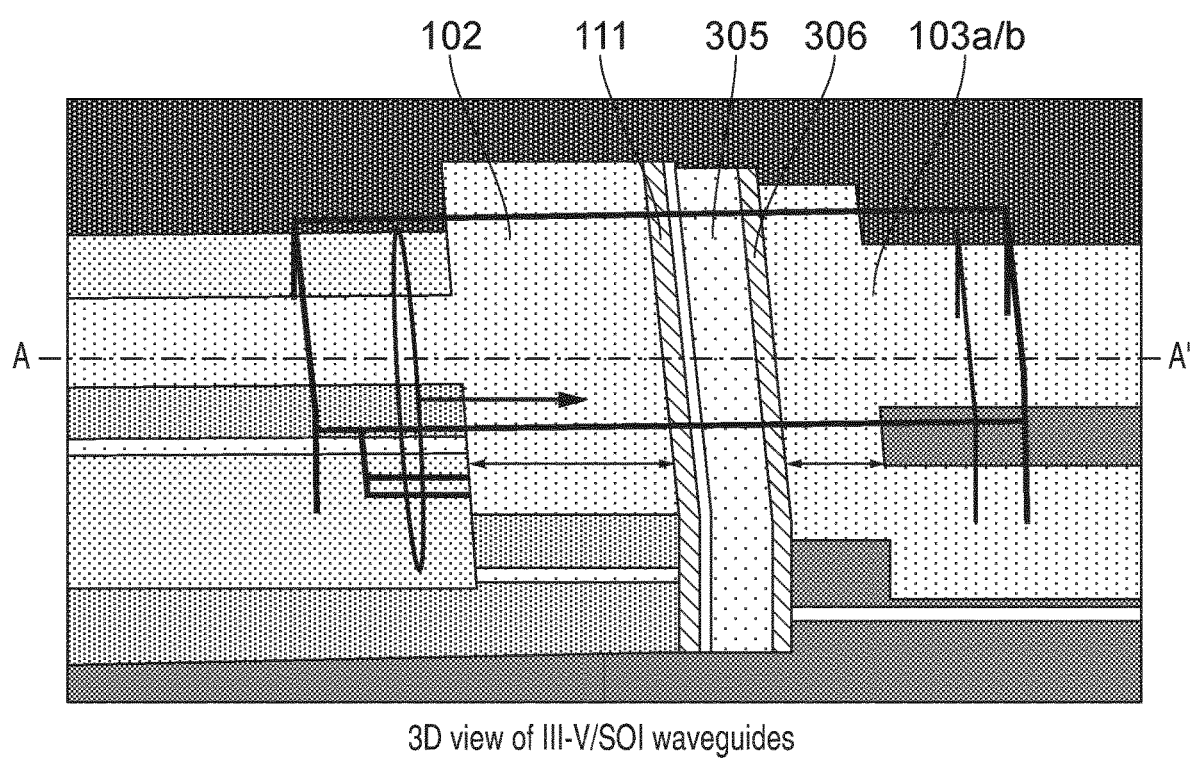
FIG. 5 show further detail of a bridge and coupling structure.

FIG. 4B is a top-down schematic of a variant interface, which may be used in place of the interface shown in FIG. 4A. Whilst it is still 'T' shaped in geometry, in the example shown in FIG. 4B there bars of the T are not angled relative to the guiding direction (A-B). FIG. 5 show further detail of the interface and coupling structure. FIG. 5 is a 3D perspective view of the interface between the III-V semiconductor based waveguide 102 and the silicon waveguides 103a/b.

Figure 6:
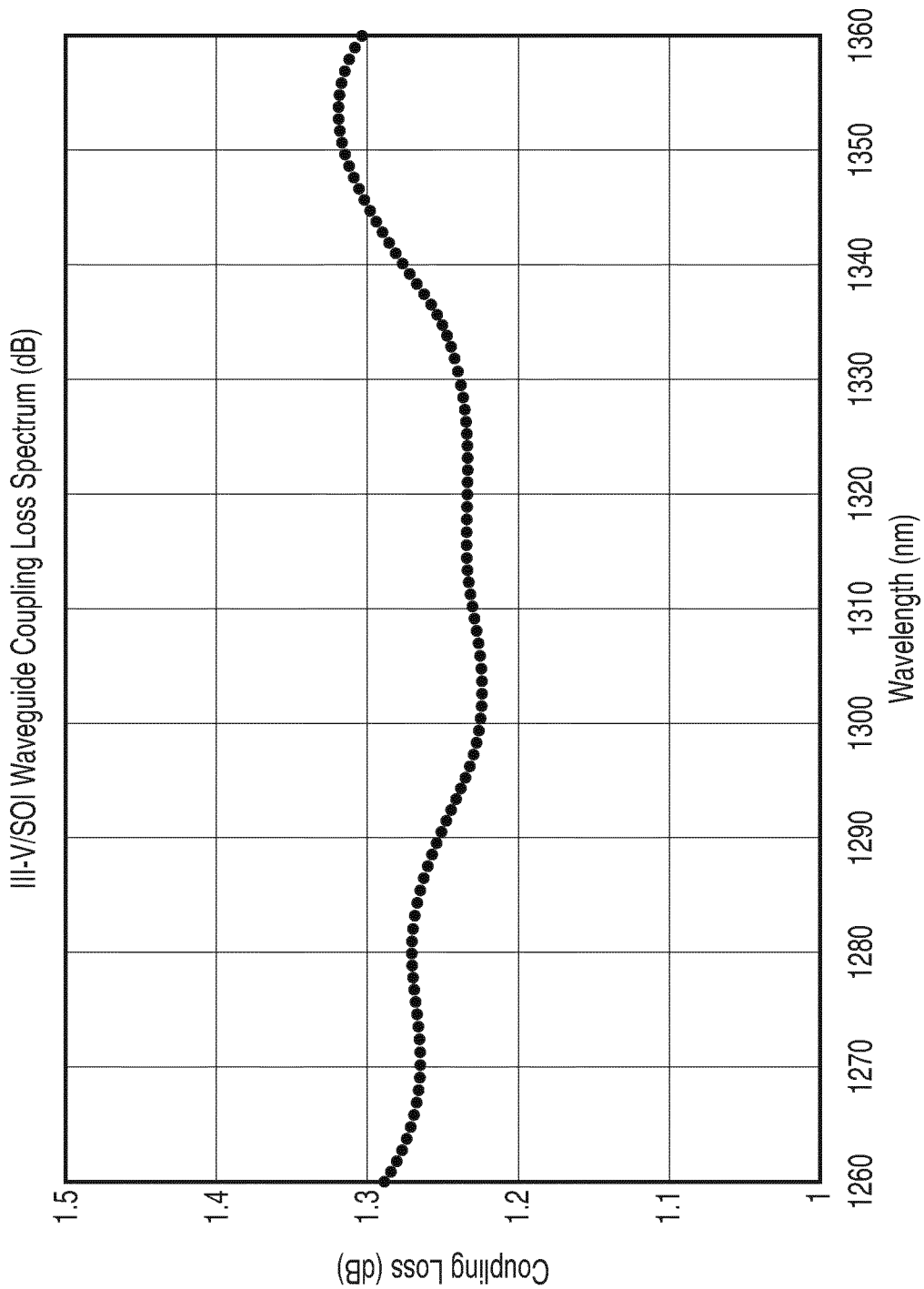
FIG. 6 is a plot of coupling loss (dB) against wavelength (nm) for a simulated bridge and coupling structure.

FIG. 6 is a plot of coupling loss (dB) against wavelength (nm) for a simulated bridge and coupling structure. Notably, the plot shows that the optical coupling loss over the O-band (around 1260 nm to around 1360 nm) is between 1.22 and 1.32 dB.

Figure 7:
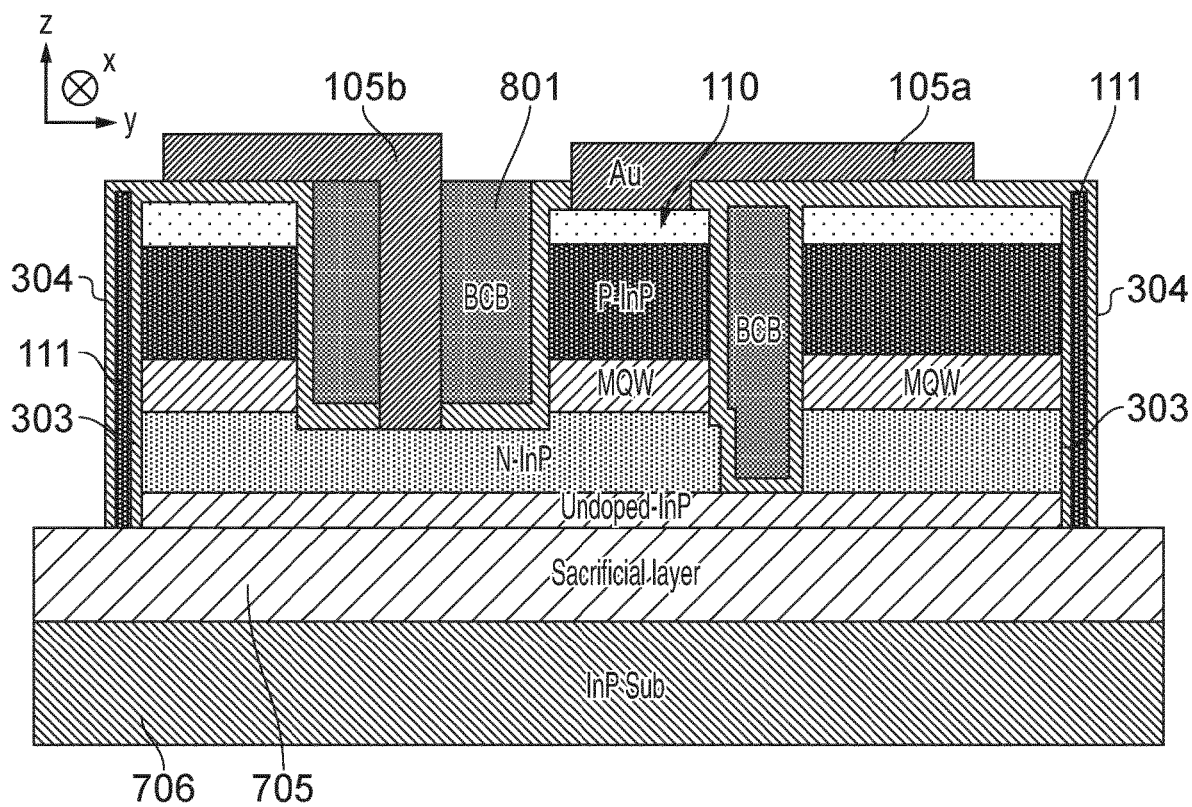
Figure 7:
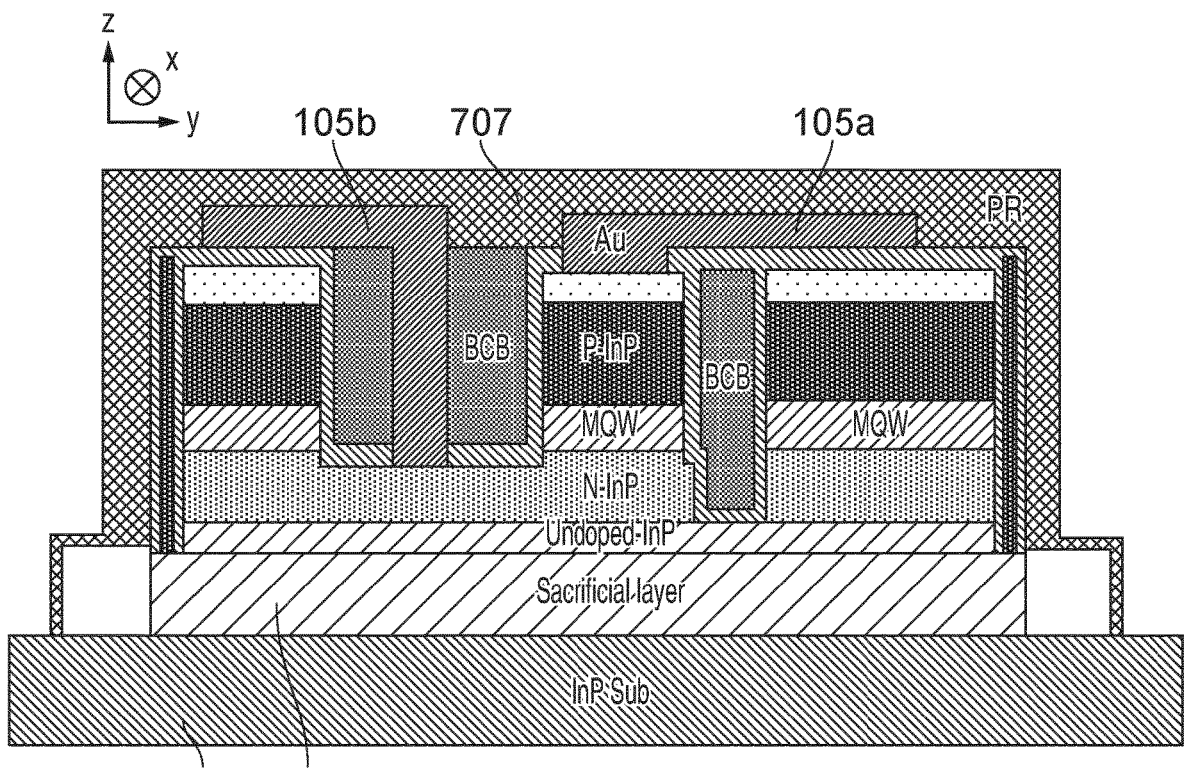

FIGS. 7(i) to 7(vi) show various manufacturing stages of a device coupon according to an embodiment of the present invention. In the step shown in FIG. 7(i), a III-V semiconductor based stack is provided. In the example shown, the stack comprises the following layers (from an uppermost layer to a lowermost layer):

701—P-doped InGaAs layer;
702—P-doped InP layer;
301—Multiple quantum well layer;
703—N-doped InP layer;
704—Undoped InP layer;
705—Sacrificial layer; and
706—InP substrate layer.

In another example, the stack has the following layers:

TABLE 1

| Layer | Multiplier | Material | Composition | Wavelength (nm) | Thickness (nm) | Doping (cm$^{-3}$) |
|---|---|---|---|---|---|---|
| 19 | | InGaAs | Lattice match to InP | | 120 + 30 | $1 \times 10^{19}$ CBr + Zn |
| 18 | | InGaAsP | | 1100 | 50 | $1.5 \times 10^{18}$ Zn |
| 17 | | InP | — | — | 1340 | $1 \times 10^{18}$ Zn |
| 16 | | InGaAsP | | 1100 | 20 | $1 \times 10^{18}$ Zn |
| 15 | | AlInAs | | | 60 | $1 \times 10^{17}$ to $1 \times 10^{18}$ Zn |
| 14 | | AlInAs | | 843 | 60 | $1 \times 10^{17}$ Zn |
| 13 | | AlInGaAs | | 968 | 70 | |
| 12 | 12× | AlInGaAs | | 1127 | 7 | |
| 11 | 12× | AlInGaAs | | 1245 | 9 | |
| 10 | | AlInGaAs | | 1127 | 7 | |
| 9 | | InGaAsP | | 1100 | 117 | |
| 8 | | InP | — | — | 80 | $2 \times 10^{17}$ Si |
| 7 | | InP | — | — | 70 | $5 \times 10^{17}$ Si |
| 6 | | InP | — | — | 920 | $8 \times 10^{17}$ Si |
| 5 | | InGaAsP | Lattice Match to InP | 1100 | 20 | Undoped |
| 4 | | InP | | | 800 | Undoped |
| 3 | | InGaAs | | | 50 | Undoped |
| 2 | Release | AlInAs | | | 500 | Undoped |
| 1 | Buffer | InP | | | 50 | Undoped |
| 0 | | | InP Substrate | | | |

Where layer 4 forms the bottom surface layer of the device coupon once separated from the InP substrate, and layers 3 and 2 are sacrificial layers used in the release of the coupon from the substrate.

These layers can be provided, for example, through molecular beam epitaxy or chemical vapour deposition. Once provided, through standard fabrication processes (e.g. etching, deposition, and masking) a III-V electro-absorption modulator (EAM) structure can be fabricated. The result of this is shown in FIG. 7(ii). The structure includes the III-V semiconductor based device 110 discussed previously. An upper layer of which is electrically connected to the first electrical contact pad 105a, and a lower layer of which (N-InP layer) is electrically connected to the second electrical contact pad 105b.

Also of note, is that the anti-reflective coating (ARC) formed of the $SiO_2$ layer 303, $Si_3N_4$ layer 111, and second $SiO_2$ layer 304 are formed as a part of the device coupon manufacture. The ARC also functions then as a facet protection coating for the sacrificial release layer etching process discussed below. The structure includes, as a fill e.g. between the III-V semiconductor based device 110 and peripheral components, a BCB fill 801. The use of BCB takes advantage of its relatively low dielectric constant, which can reduce parasitic capacitance and so provide a higher operating speed.

Next, in a step the results of which are shown in FIG. 7(iii), a dry etching process is performed to remove the portions of the sacrificial layer 705 which have an exposed upper surface. That is, the portions of the sacrifice layer which extend laterally beyond the ARC are removed as shown in FIG. 7(iii). This step 'releases' the multi-layered stack, in that it is ready for subsequent processing. An upper surface of the InP substrate is thereby exposed, as are lateral sides of the sacrifice layer 705. Subsequently, in a step shown in FIG. 7(iv), a photoresist tether (PR) 707 is applied to the outside of the device coupon, at least partially covering the coupon sidewall, the ARC and upper surfaces. Notably, the lateral sides of the sacrificial layer 705 remain exposed (the result of the partial coverage of the coupon sidewall and the ARC).

Figure 7V:
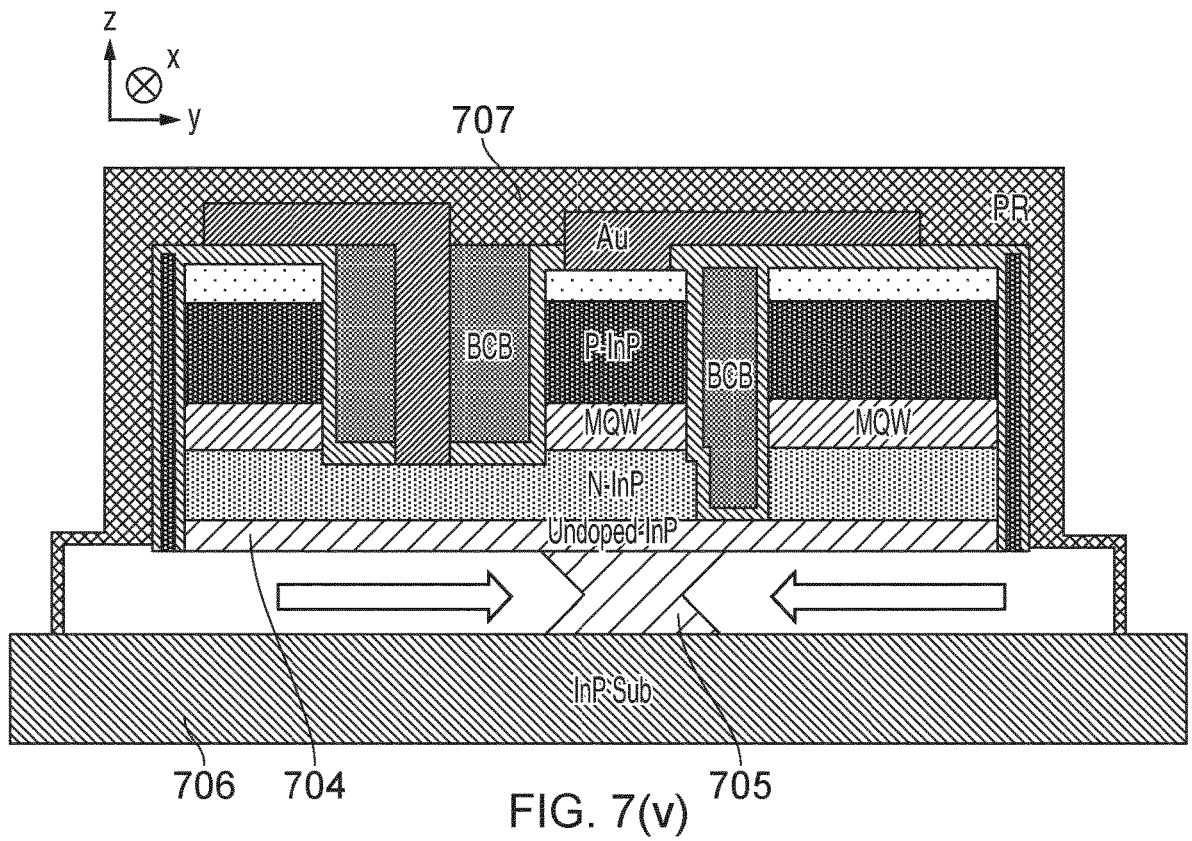
Figure 7:
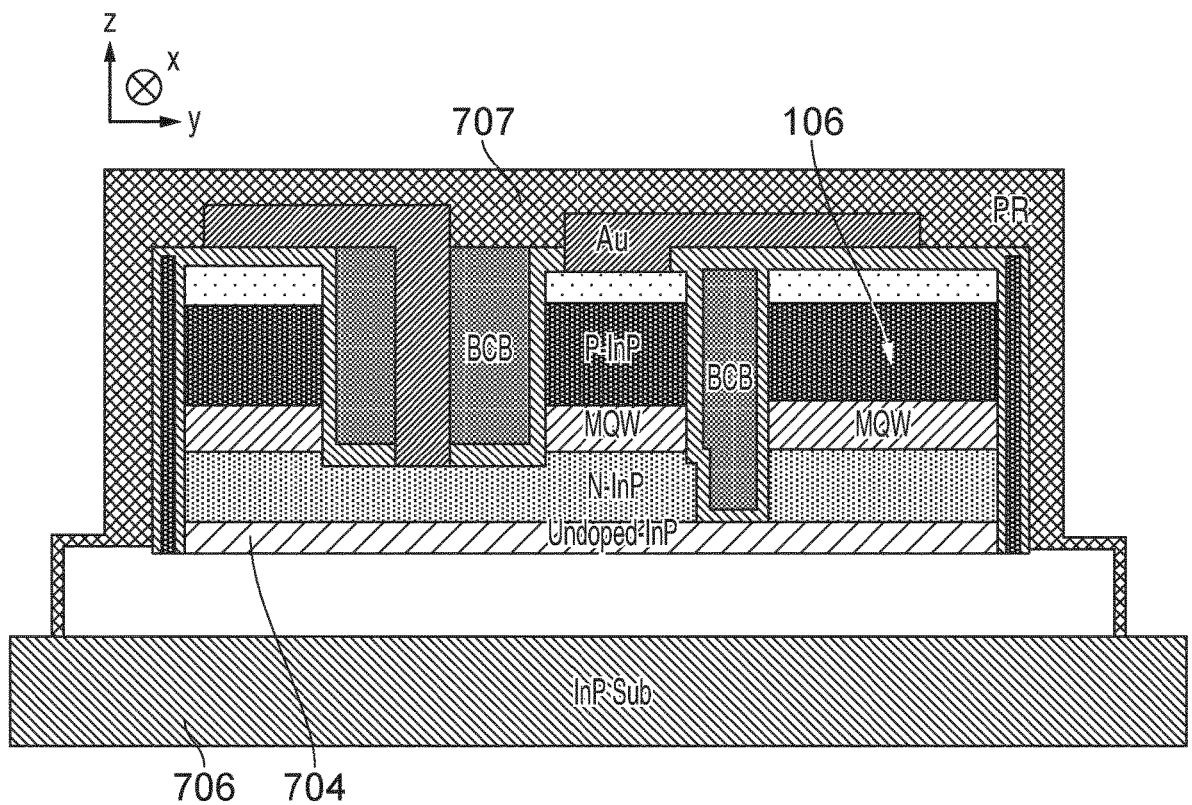

After this, in a step show in FIG. 7(v), a wet etch process is started to begin removing the sacrificial layer 705. The etch proceeds in the direction shown, i.e. laterally towards the centre of the coupon from the periphery thereof. When the wet etch process is completed, a structure shown in FIG. 7(vi) results. The coupon 106 is suspended by the photoresist 707 above the InP substrate 704, with the lowermost surface of the undoped InP layer 704 facing the uppermost surface of the substrate. The device coupon is then ready for transfer printing.

Figure 8I:
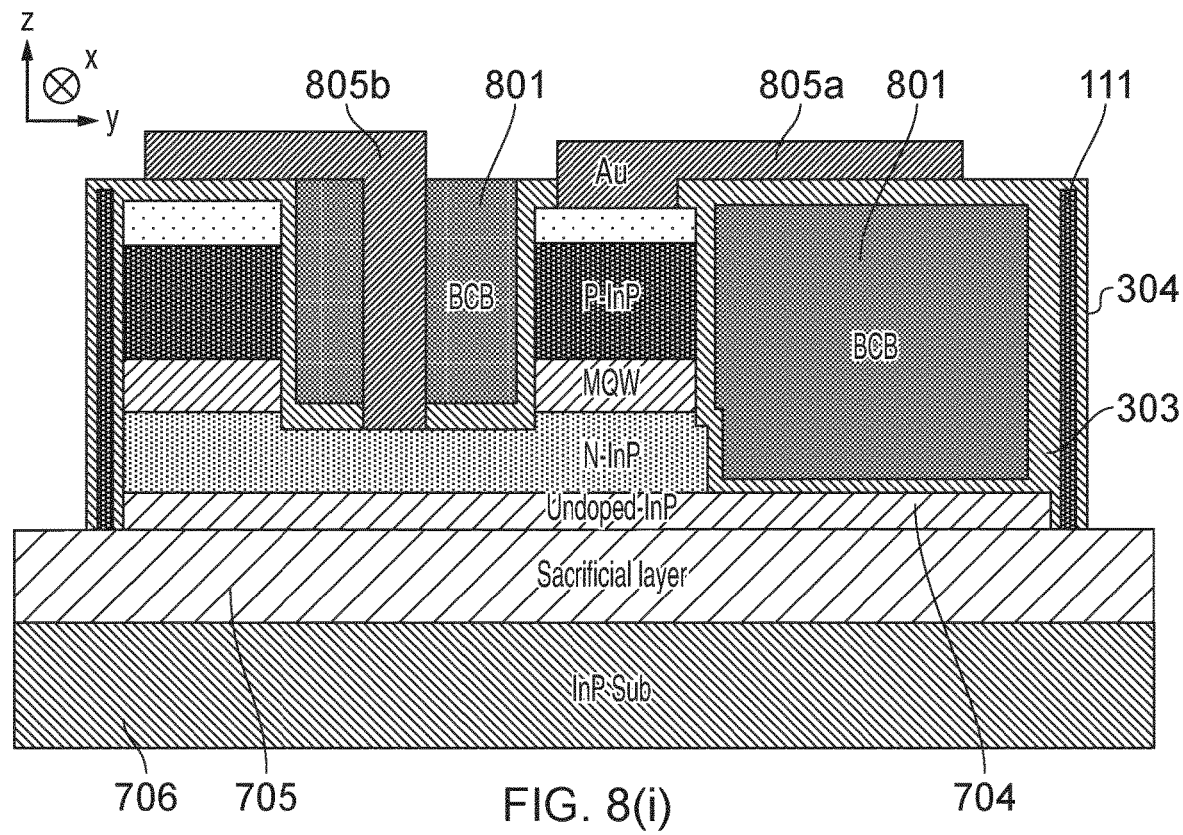
FIGS. 8(i) to 8(v) show various manufacturing stages of a variant device coupon according to an embodiment of the present invention.
Figure 8:
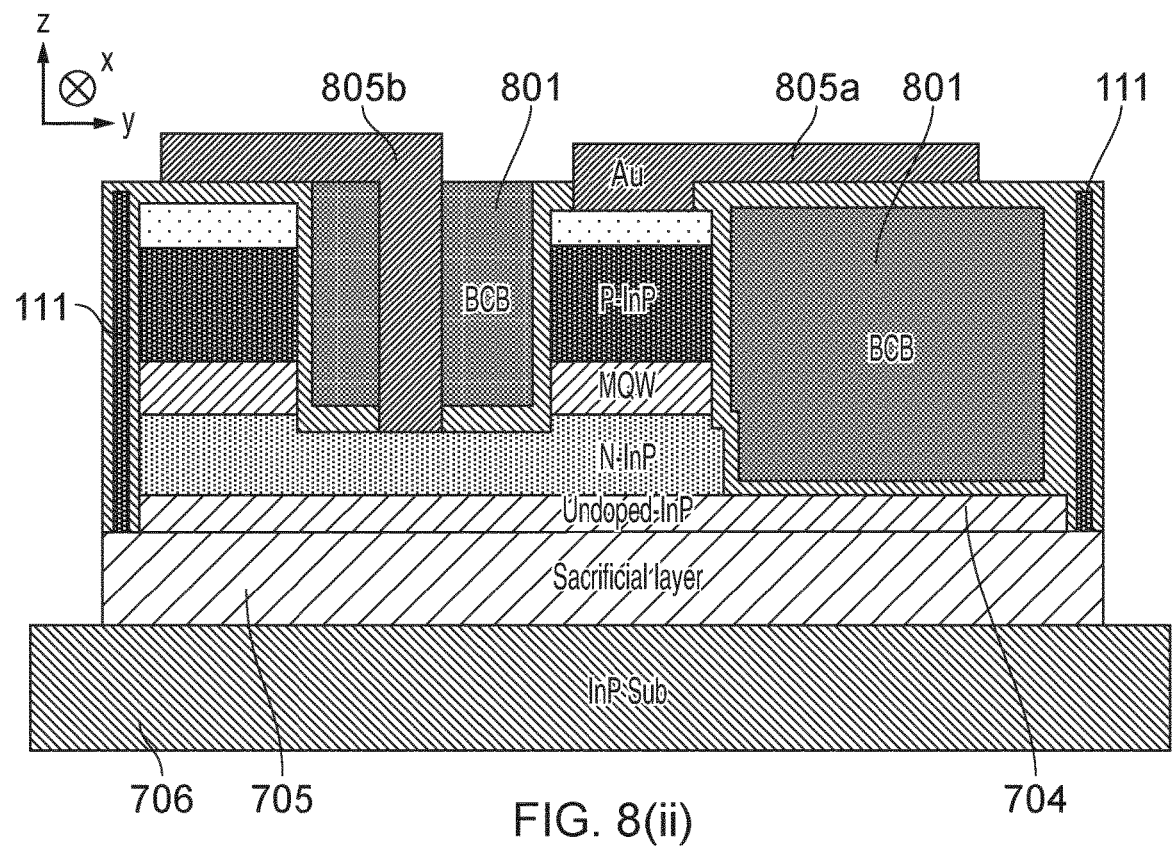
Figure 8:
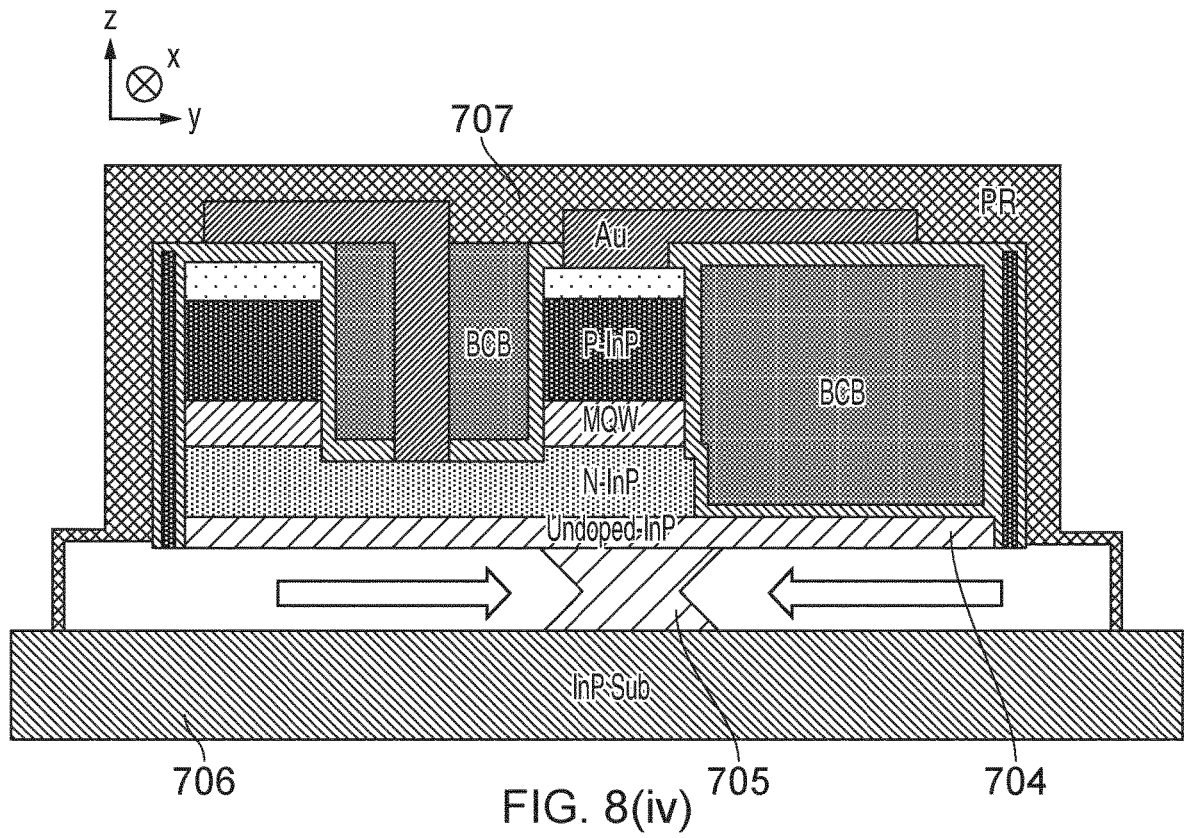
Figure 8V:
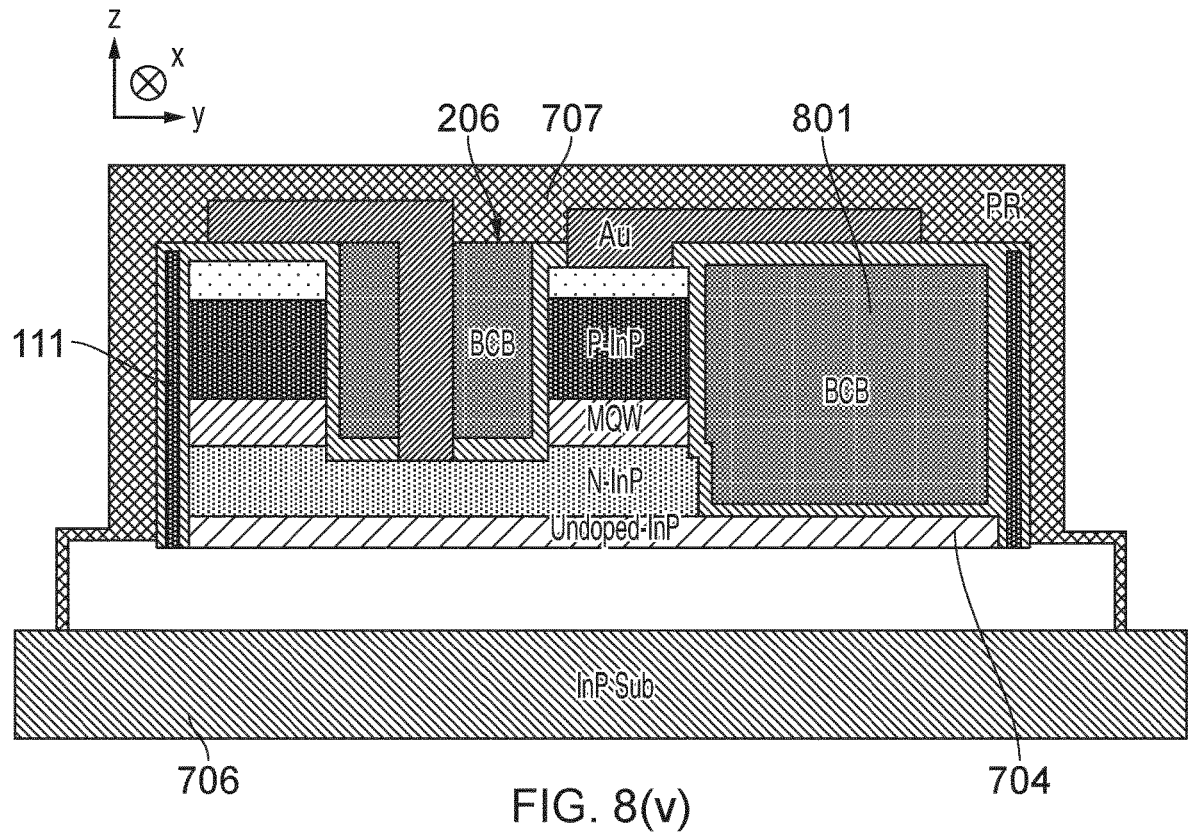

FIGS. 8(i) to 8(v) show various manufacturing stages of a variant device coupon according to an embodiment of the present invention. The method shown in FIGS. 8(i) to 8(v) starts after the step shown in FIG. 7(i); that is the provision of a multi-layered epitaxial stack formed of III-V semiconductor layers. In a step the results of which are shown in FIG. 8(i), standard fabrication processes (e.g. etching, deposition, and masking) a variant III-V electro-absorption modulator (EAM) structure can be provided. The structure in FIG. 8(i) differs from that in FIG. 7(ii) in that electrode traces 805a and 805b are provided which will electrically connect to contact pads which extend at least partially onto the silicon platform (as discussed previously in relation to FIGS. 2A and 2B).

After the step shown in FIG. 8(i), a dry etch process is performed to remove the portions of the sacrificial layer 705 which have an exposed upper surface. The result of this is shown in FIG. 8(ii). An upper surface of the InP substrate 706 is thereby exposed, as are lateral sides of the sacrificial layer 705. Subsequently, in a step shown in FIG. 8(iii), a photoresist tether 707 is applied to the outside of the device coupon, at least partially covering the ARC and upper surfaces. Notably, the lateral sides of the sacrificial layer 705 remain exposed (the result of the partial coverage).

After this step, in a step shown in FIG. 8(iv), a wet etch process is started to begin removing the sacrificial layer 705. The etch proceeds in the direction shown, i.e. laterally towards the centre of the coupon from the periphery thereof. When the wet etch process is completed, a structure shown in FIG. 8(v) results. The coupon 206 is suspended by the photoresist 707 above the InP substrate 704, with the lowermost surface of the undoped InP layer 704 facing the uppermost surface of the substrate. The device coupon is then ready for transfer printing.

Figure 9I:
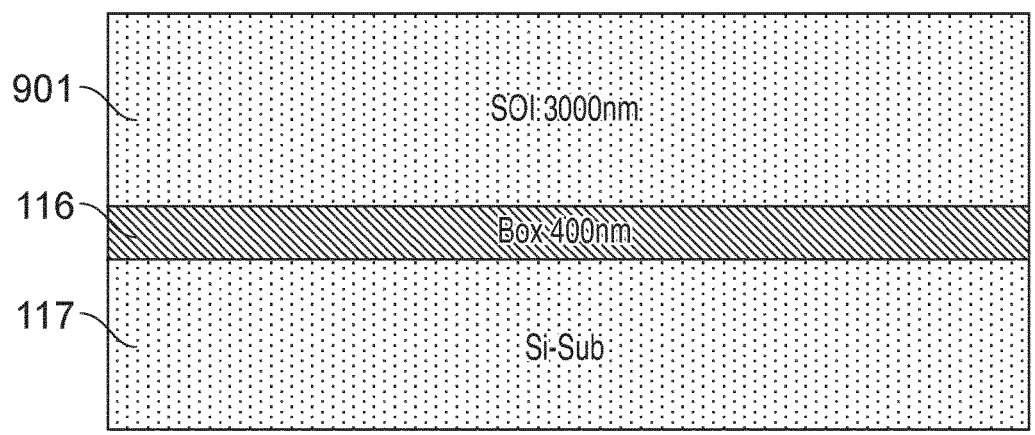
FIGS. 9(i) to 9(v) show various manufacturing stages of a silicon platform according to an embodiment of the present invention.
Figure 9:
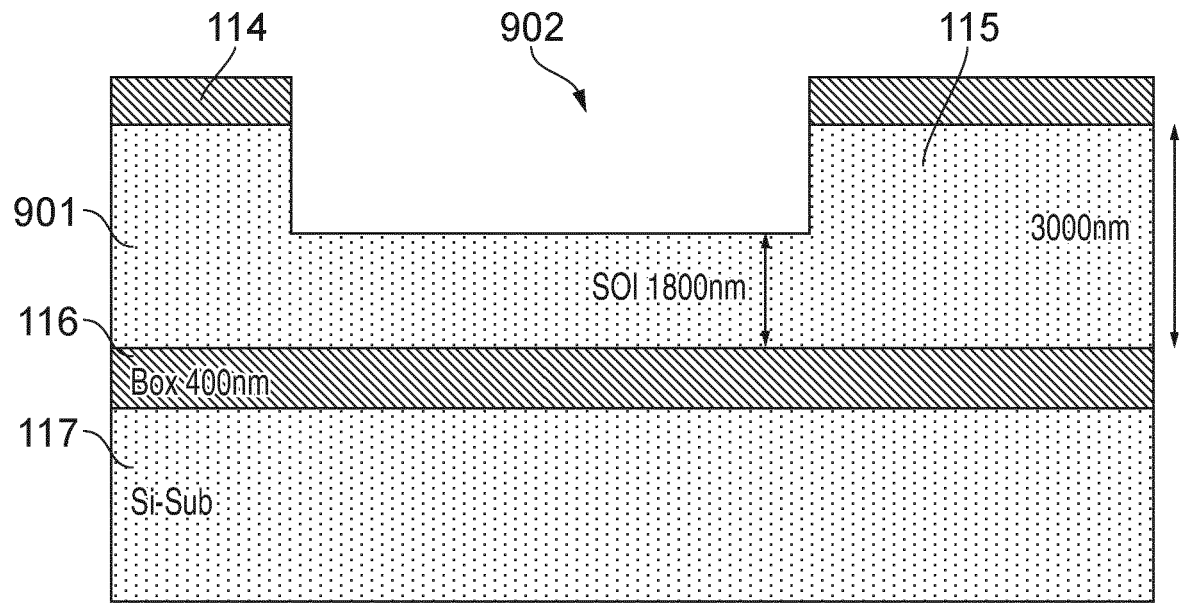
Figure 9:
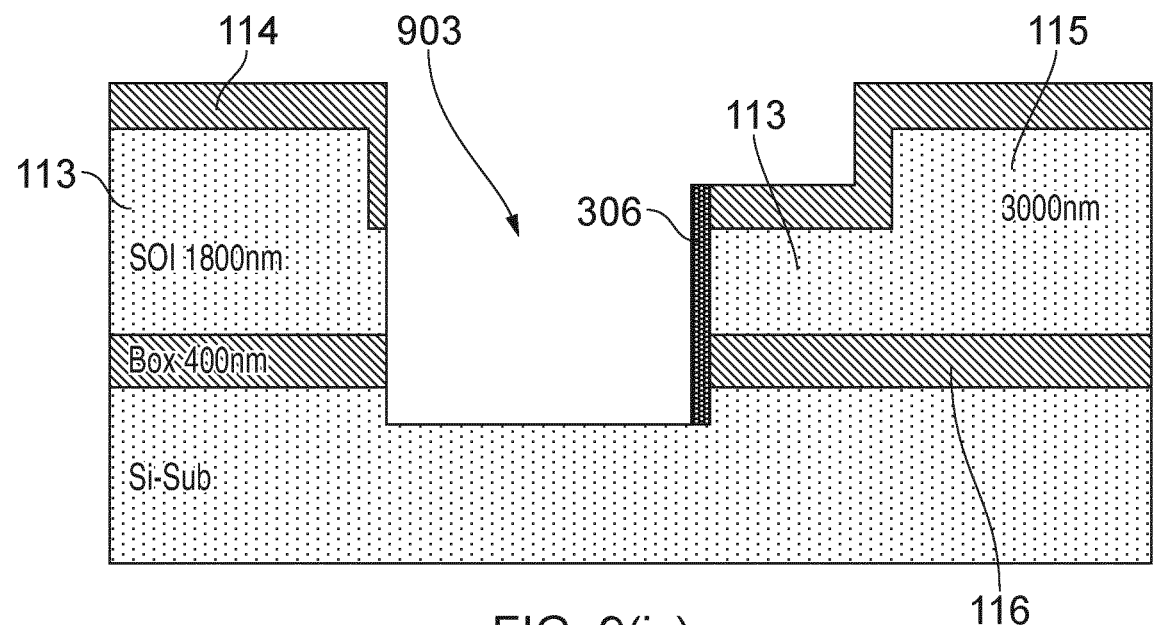
Figure 9V:
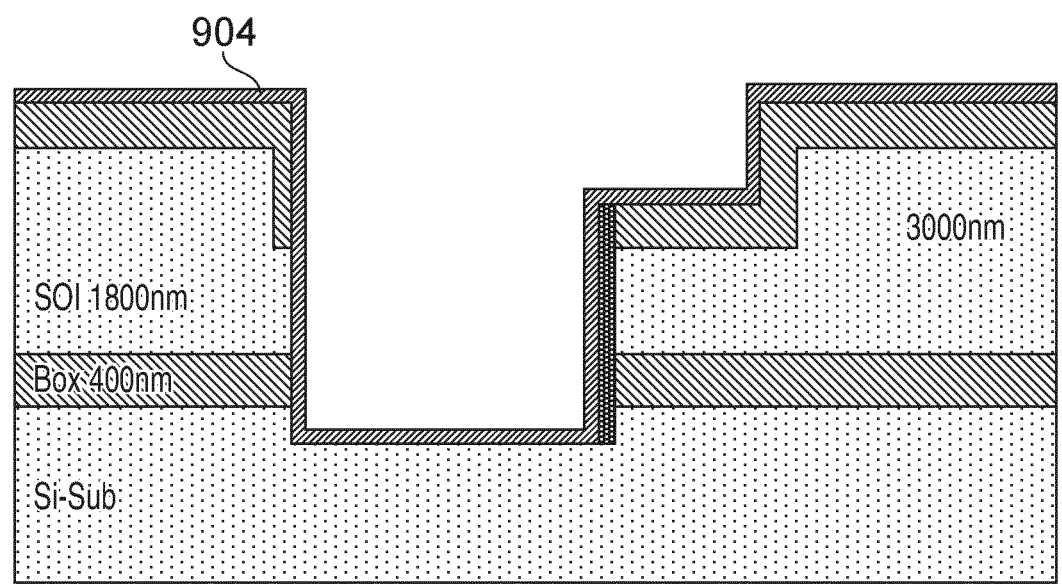

FIGS. 9(i) to 9(v) show various manufacturing stages of a silicon platform according to an embodiment of the present invention. In a first step, shown in FIG. 9(i), a silicon-on-insulator wafer is provided. A silicon device layer 901, which is around 3000 nm or 3 μm tall, is above a 400 nm buried oxide (e.g. $SiO_2$) layer 116. The buried oxide layer is above the silicon substrate 117.

Next, in a step the results of which are shown in FIG. 9(ii), a first cavity 902 is etched into the silicon device layer. A part of this step includes the deposition of cladding layer 114 (formed here of silicon dioxide). The first cavity is etched so that a 1800 nm portion of the silicon device layer remains above the buried oxide layer. This etch also provides the 3 μm to 1800 μm waveguide taper discussed previously, which functions as a mode converter for light passing through the taper.

After the taper has been provided, a second etch is performed to form second cavity 903. This second cavity extends through the buried oxide layer and partially into the silicon substrate. The exact depth of the etch is chosen such that an optical mode supported by the 1800 nm silicon waveguide 113 is generally aligned with an optical mode supported by the III-V semiconductor based waveguide 102 (when present in the cavity 903). The surface roughness (e.g. $R_a$, $R_z$, or $R_{MAX}$) of the bed of the second cavity is preferably at a sub nanometre level, as measured using an atomic force microscope. The measured area is typically around 10 μm by 10 μm.

Next, in a step shown in FIG. 9(iv) the 180 nm $Si_3N_4$ anti-reflective coating is provided on one or more sidewalls of the cavity 903. The silicon platform is then ready for micro-transfer printing. FIG. 9(v) shows an optional further step, where an adhesive layer 904 (such as BCB) is spun-coated onto the silicon platform. The adhesive layer is between 30 nm and 100 nm thick.

Figure 10I:
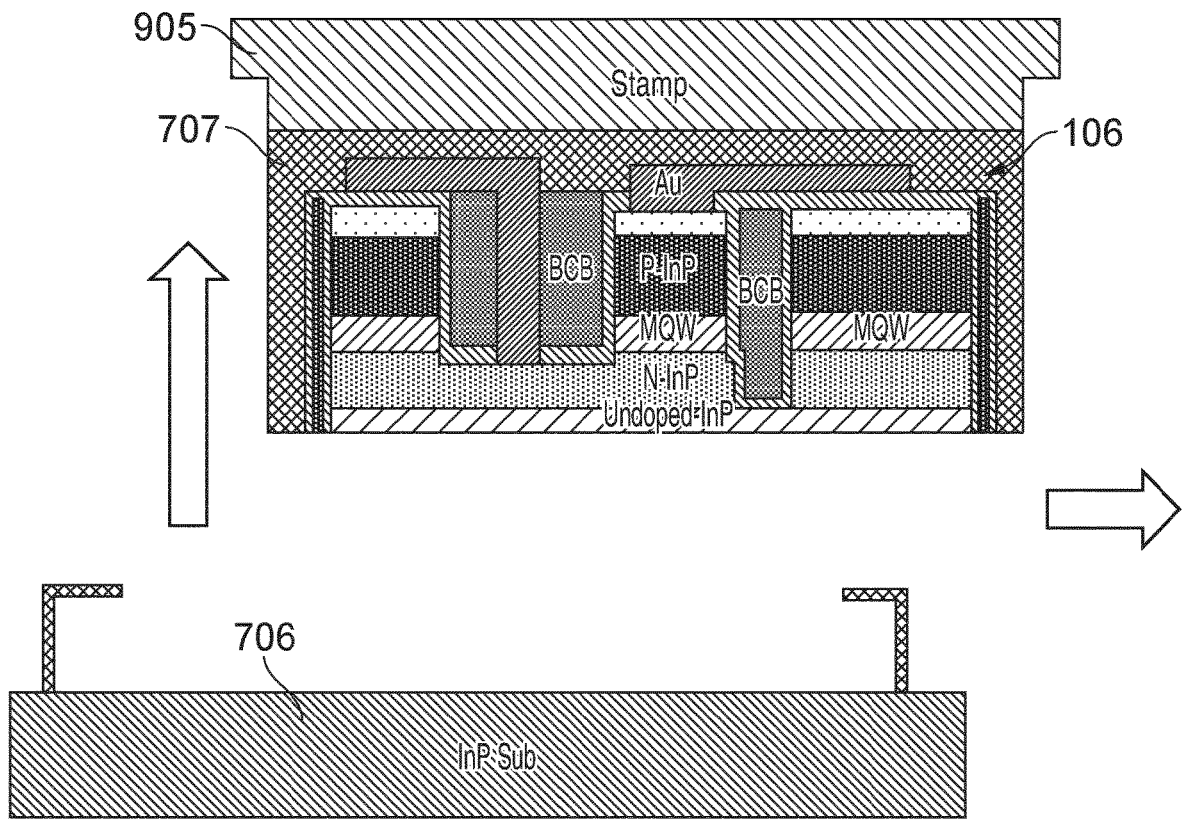
FIGS. 10(i) to 10(viii) show various manufacturing stages of an optoelectronic device according to an embodiment of the present invention.
Figure 10:
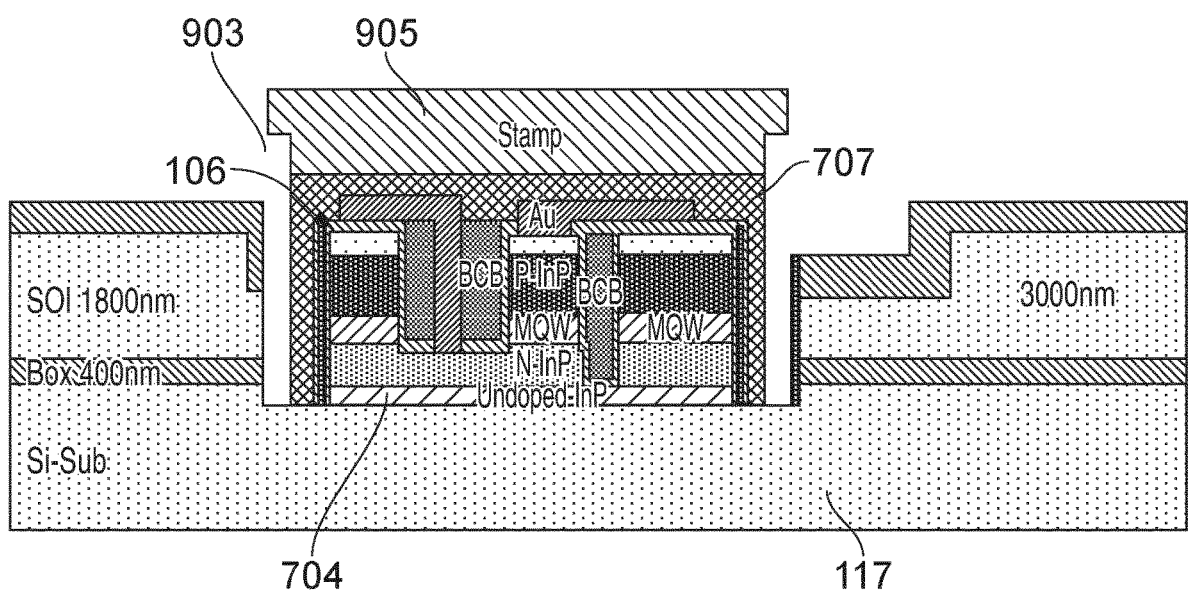
Figure 10:
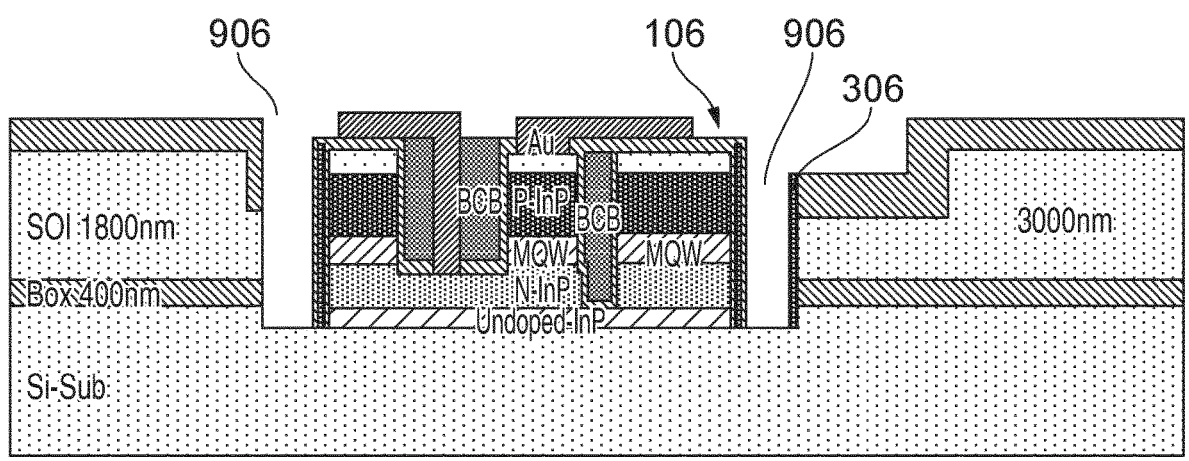

FIGS. 10(i) to 10(viii) show various manufacturing stages of an optoelectronic device according to an embodiment of the present invention. In a first step, shown in FIG. 10(i) a stamp (in some examples an elastomer stamp) is used to pick up the device coupon 106 by attaching to the photoresist tether 707. In a first movement, indicated by the left-hand arrow in FIG. 10(i), the stamp and device coupon 106 are lifted up and away from the InP substrate 706 which breaks the tethers. Subsequently, the stamp and device coupon are moved laterally towards the silicon platform.

Next, in a step shown in FIG. 10(ii), the device coupon 106 is deposited into the second cavity 903 formed in the silicon platform earlier. This deposition step includes aligning the III-V semiconductor based waveguide 102 within the device coupon 106 with the 1800 nm silicon waveguide. Once deposited, a lowermost surface of the undoped InP layer 704 directly abuts an upper surface of the silicon substrate layer 117 (asides from examples where an adhesive 904 is used, in which case the adhesive will sit between the undoped InP layer and the silicon substrate).

Subsequently, in a step shown in FIG. 10(iii) the stamp is released and the device coupon 106 is left within the cavity 903. Once the stamp has been released, the photoresist 707 is then removed using a dry etching process. The combination of device coupon 106 and silicon platform is then annealed at a temperature of between 280° C. and 300° C. inclusive for at least 1 and no more than 15 hours. The result of this processing is shown in FIG. 10(iv). Also of note, in FIG. 10(iv) is channel 906 which surround a periphery of the device coupon 106 between the device coupon and the sidewalls of the cavity 903. The channel 906 thereby defines a boundary around the device coupon 106.

Figure 10V:
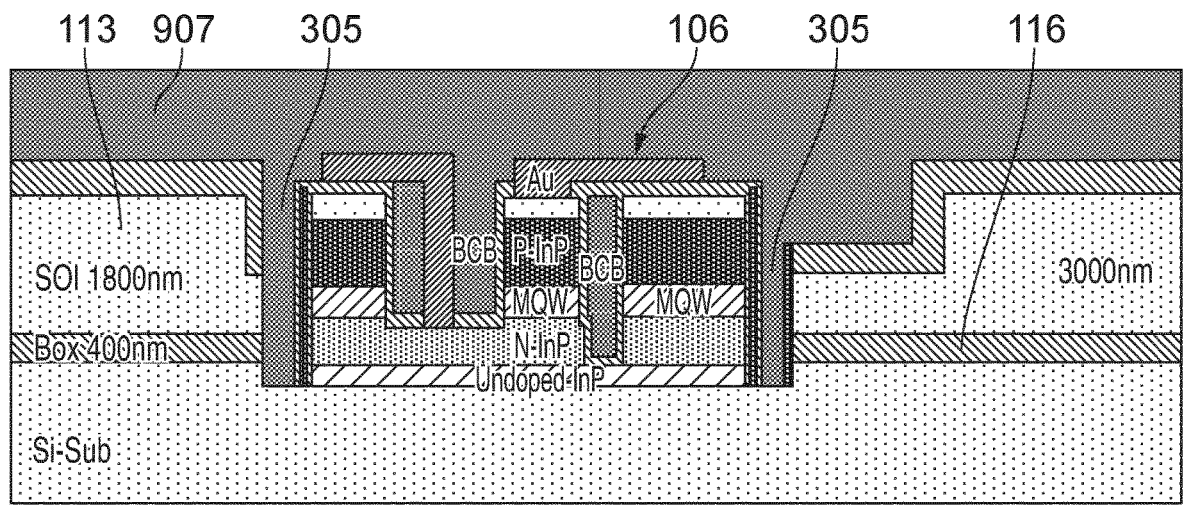
Figure 10:
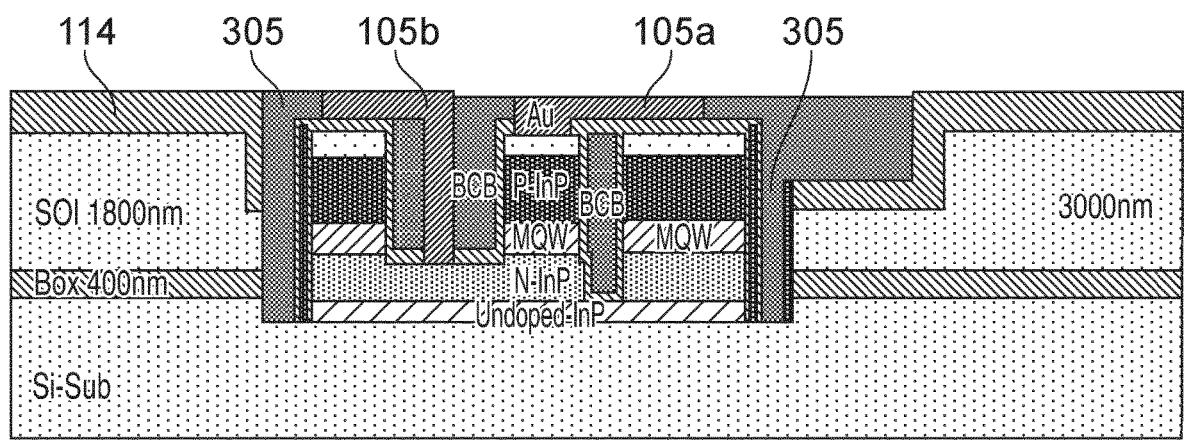

After the annealing step, the combination of device coupon 106 and silicon platform is then spun coated with a polymer 907 (in this example Benzocyclobutene) and thermally cured at around 280° C. for around 60 minutes in a nitrogen atmosphere ($N_2$). The result of this spin coating step is shown in FIG. 10(v). Notably the spun coated BCB 907 fills the channel 906 and provides the bridge fill 305 discussed previously.

After the thermal curing process has completed, the polymer 907 is etched back in a dry etch step (using, for example, $O_2$ $CF_4$, or $SF_6$ gas) such that the upper surface of contact pads 105a and 105b are exposed, as well as cladding layer 114. The result of this is shown in FIG. 10(vi). As an alternative, photosensitive BCB can be used for the channel 906 filling. In this case, the photosensitive BCB functions like a negative photoresist. The upper surface of contact pads 105a and 105b can be exposed after the BCB spin coating, UV exposure and develop followed by the thermal curing process. Subsequently, further cladding layer 114 is added as shown in FIG. 10(vii) to isolate the bridge fill 305 from moisture. This cladding layer, in some examples formed from $SiO_2$, has a thickness of around 500 nm. Finally, in a step shown in FIG. 10(viii), vias are opened in the cladding layer above the contact pads 105a and 105b for wire bonding.

Figure 11I:
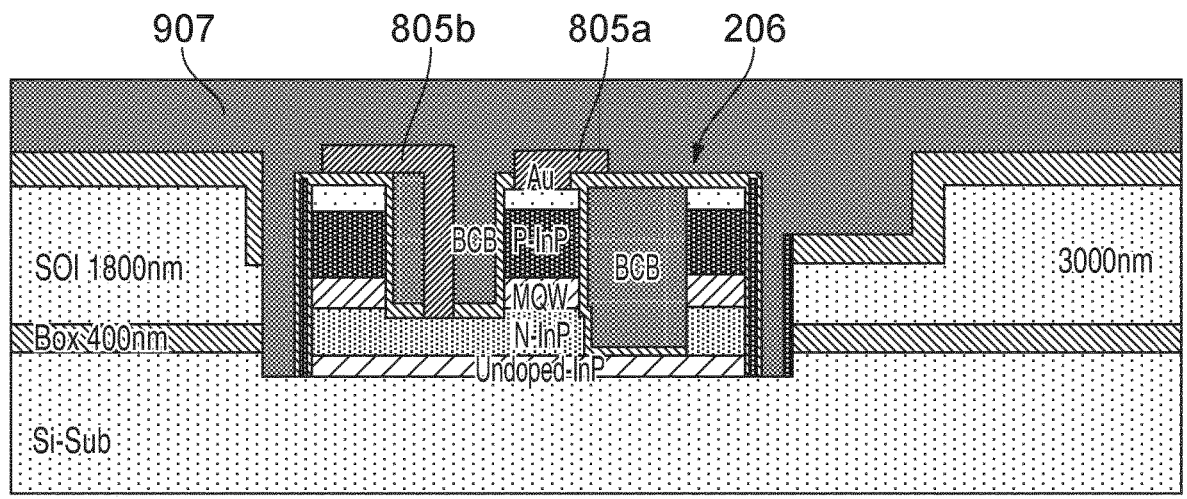
FIGS. 11(i) to 11(v) show various variant manufacturing stage of an optoelectronic device according to an embodiment of the present invention.
Figure 11:
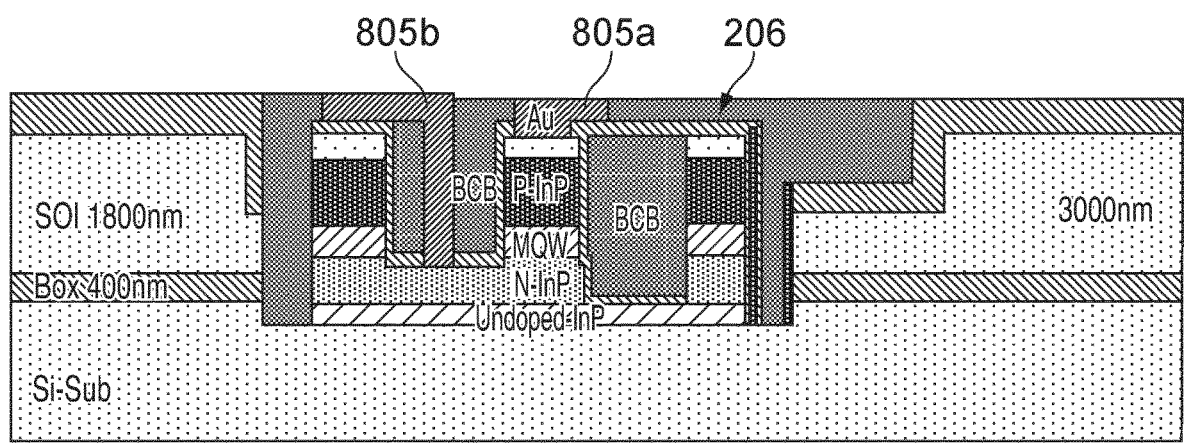
Figure 11:
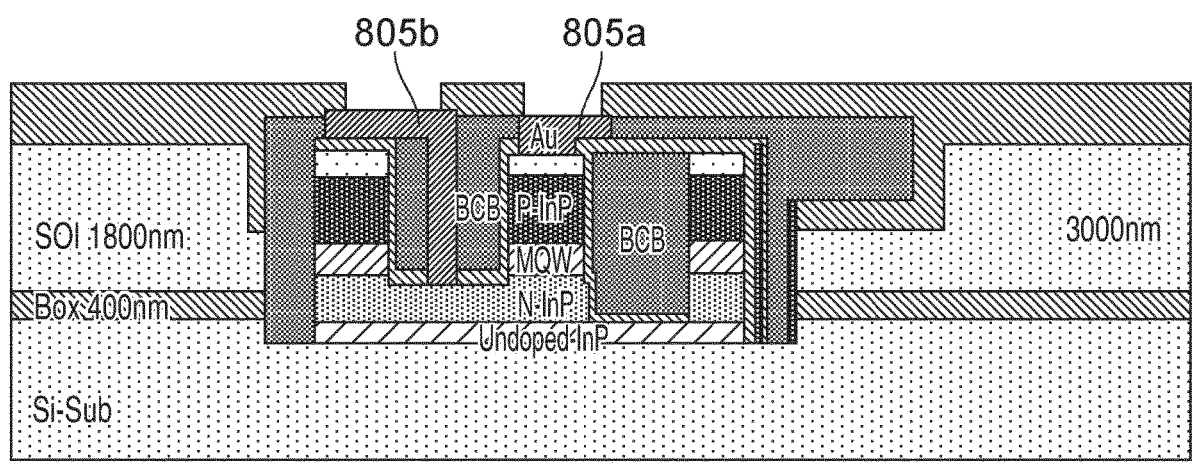
Figure 11V:
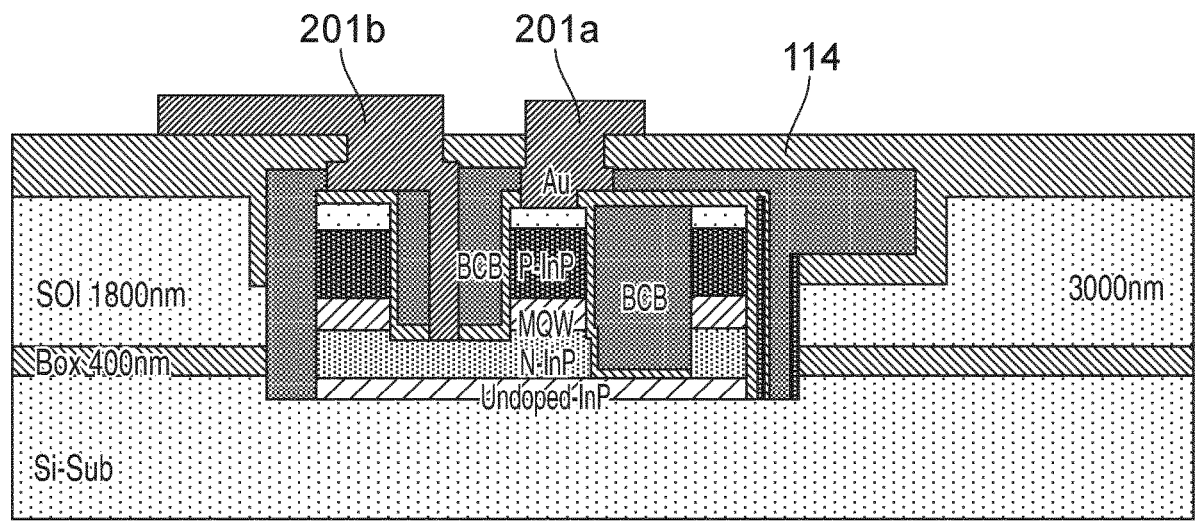

FIGS. 11(i) to 11(v) show various variant manufacturing stage of an optoelectronic device according to an embodiment of the present invention. The steps shown in FIGS. 10(i) to 10(v) are repeated using the device coupon 206 discussed with relation to FIGS. 8(i) to 8(v). The result, as shown in FIG. 11(i) is a device coupon 206 which has been bonded to the silicon substrate of the silicon platform. The spun coated polymer 907 again fills the channels 906, and the device has been thermally cured at around 280° C. for around 60 minutes in a nitrogen atmosphere ($N_2$).

Next, as shown in FIG. 11(ii) an etching and/or planarization process is performed so that the upper surface of wire traces 805b and 805a are exposed. As an alternative, photosensitive BCB can be used for the channel 906 filling. In this case, the photosensitive BCB functions like a negative photoresist. The upper surface of contact pads 105a and 105b can be exposed after the BCB spin coating, UV exposure and develop followed by the thermal curing process. After this further cladding material is deposited to provide a 500 nm thick $SiO_2$ cladding layer 114, as shown in FIG. 11(iii). After this deposition, vias are opened in the cladding layer 114 above the traces 805a and 805b. The result of this is shown in FIG. 11(iv). This allows for a metallization process to provide contact pads 201a and 201b, which extend at least partially over the silicon platform. The device is then ready for wire bonding and operation.

Figure 12:
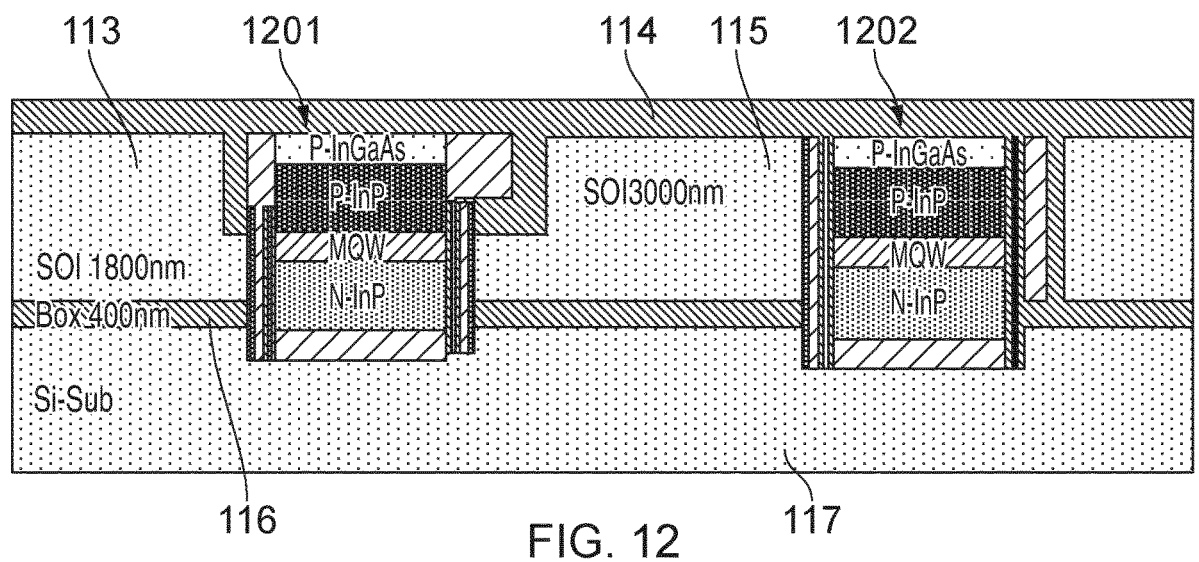
FIG. 12 shows a section view of two optoelectronic devices on a single silicon platform according an embodiment of the present invention.

FIG. 12 shows a section view of two optoelectronic devices on a single silicon platform according an embodiment of the present invention. In this example, three cavities are formed: a first cavity at least partially defining a 1800 nm silicon waveguide; a second cavity within which a III-V semiconductor based electro-absorption modulator 1201 has been printed; and a third cavity adjacent to a 3000 nm silicon waveguide 115 within which a III-V semiconductor based laser 1202 has been deposited. The III-V semiconductor based electro-absorption modulator 1201 is optically coupled to a first and second 1800 nm silicon waveguide 113. In use, laser 1202 produces an optical signal which is coupled into the 3000 nm silicon waveguide 115, a taper in or between the 3000 nm and 1800 nm silicon waveguides coverts the optical mode to one which is couplable into the EAM 1201. The EAM 1201 imparts a modulation profile to the signal, which is then coupled into 1800 nm silicon waveguide 113 for further transmission.

Figure 13:
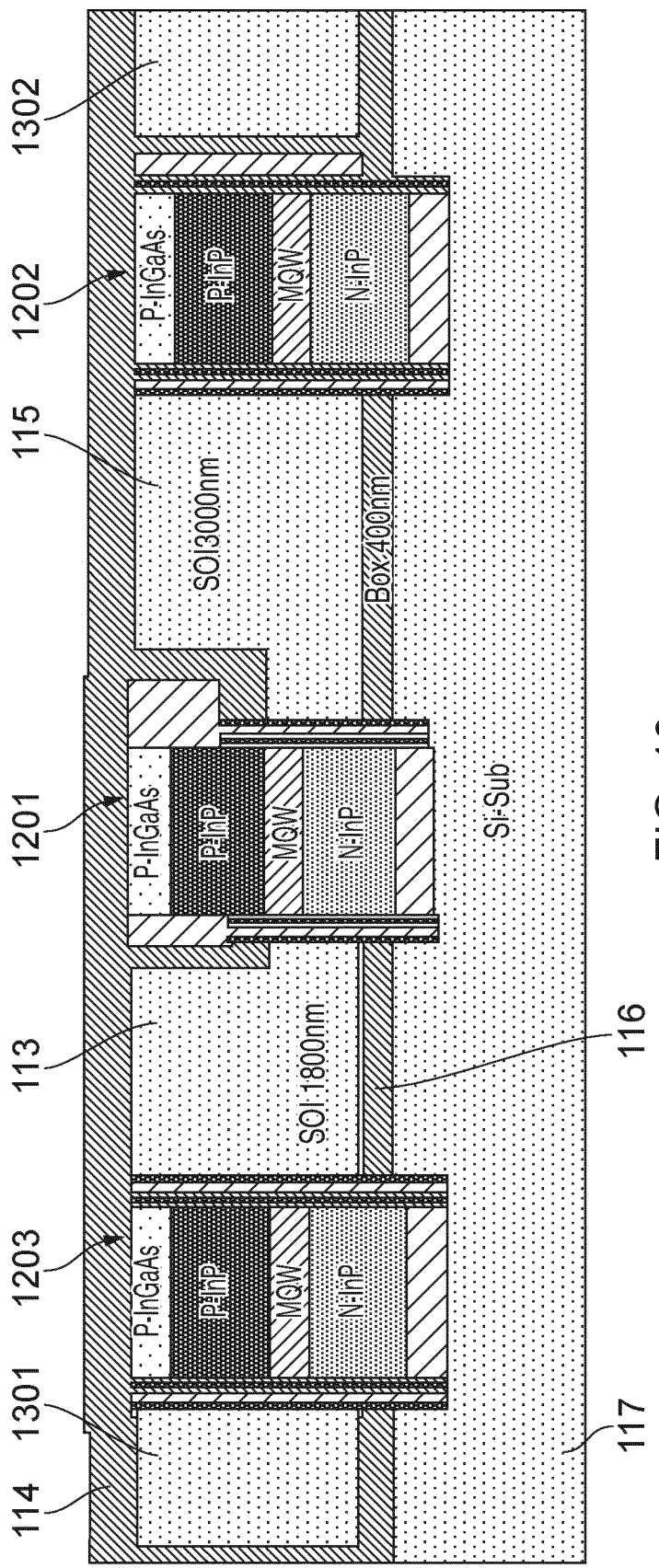
FIG. 13 shows a section view of three optoelectronic devices on a single silicon platform according to an embodiment of the present invention.

FIG. 13 shows a section view of three optoelectronic devices on a single silicon platform according to an embodiment of the present invention. The arrangement in FIG. 13 differs from that in FIG. 12 in that it further includes a semiconductor optical amplifier, SOA, 1203, which is located in a fourth cavity. The SOA is configured to receive signals from the EAM, via 1800 nm silicon waveguide 113, and amplify them before coupling them into output waveguide 1301.

Figure 14:
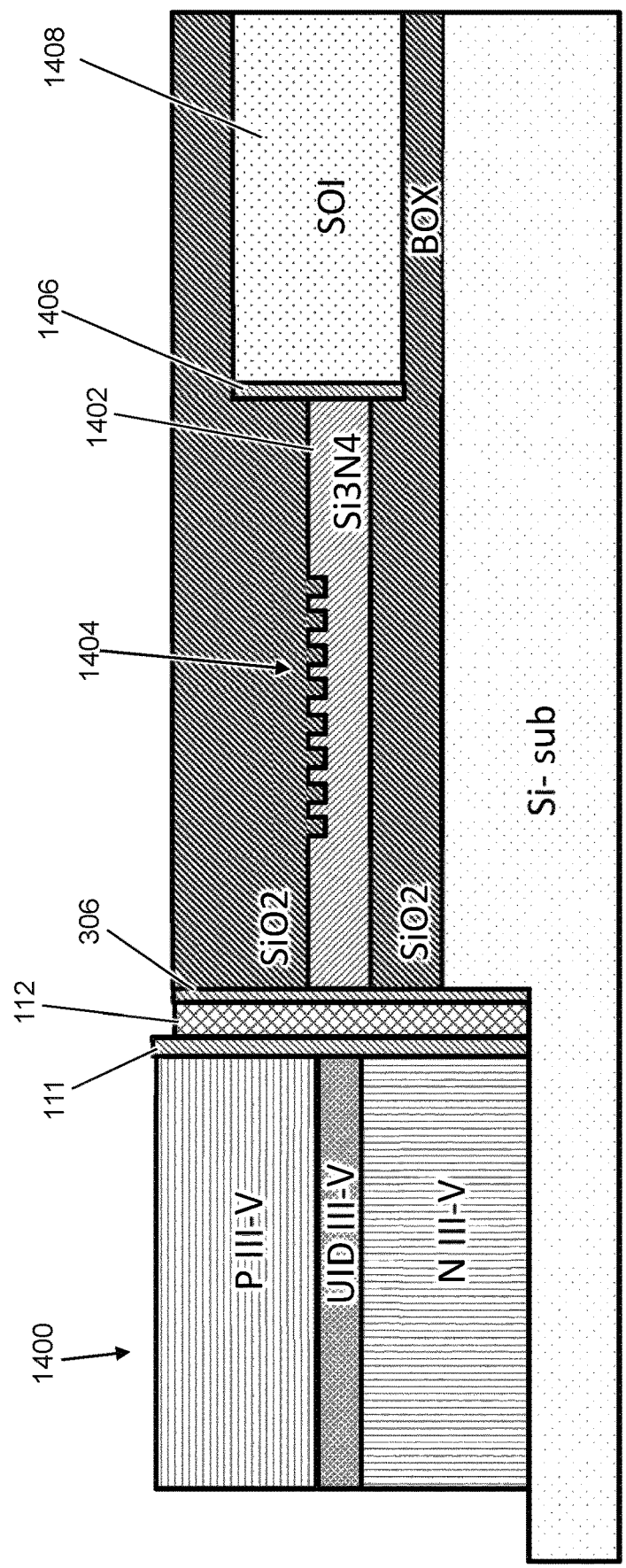
FIG. 14 shows a section view of a variant optoelectronic device according to an embodiment of the present invention.

FIG. 14 shows a section view of a variant optoelectronic device according to an embodiment of the present invention. A photonic component 1400, of the type discussed previously, has been bonded to a bed of a cavity formed in silicon substrate Si-sub of a silicon platform. The silicon platform includes a silicon nitride ($Si_3N_4$) waveguide 1402, in which is a Bragg grating 1404. The silicon nitride waveguide 1402 is coupled to the photonic component as well as a silicon waveguide 1408 formed in a silicon on insulator layer.

Between the silicon nitride waveguide 1402 and silicon waveguide 1408 is an antireflective coating 1406. Between the photonic component 1400 and the silicon nitride waveguide 1402 are antireflective coatings 111 and 306 as well as the bridge fill 112.

Figure 15:
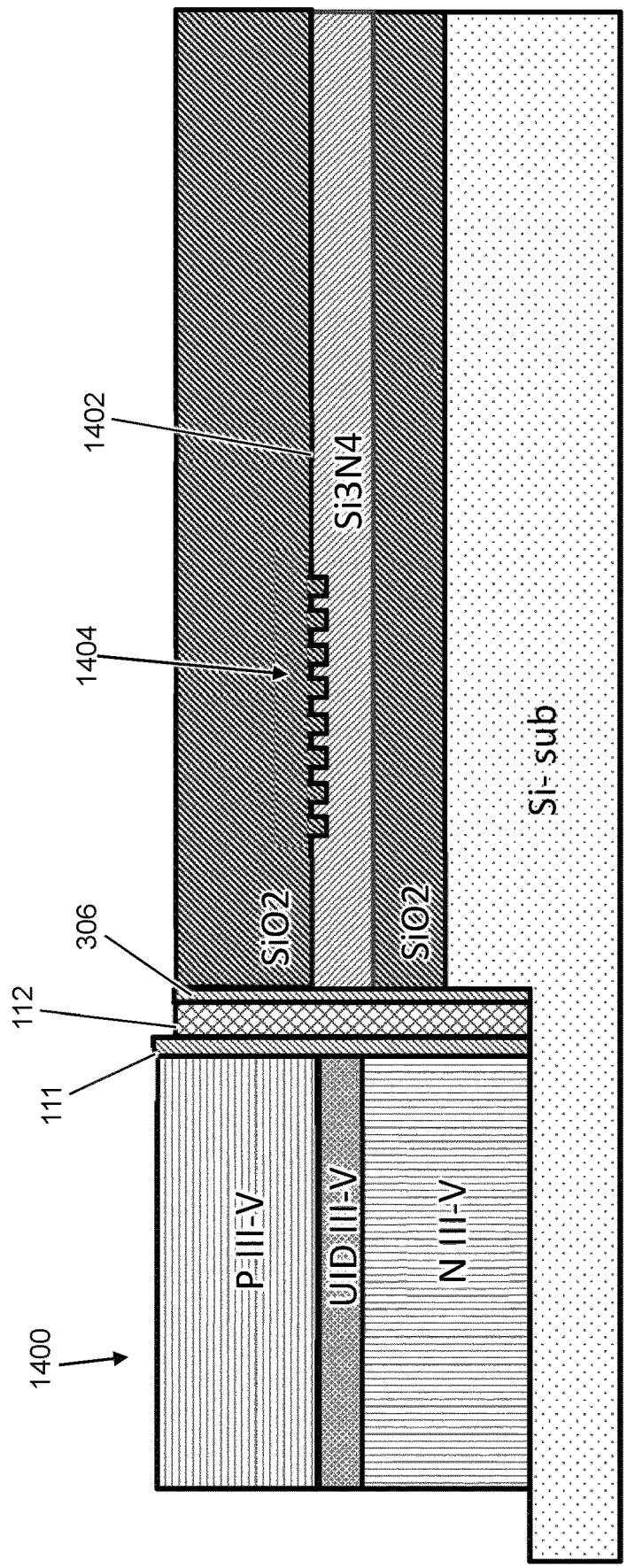
FIG. 15 shows a section view of a variant optoelectronic device according to an embodiment of the present invention.
Figure 16:
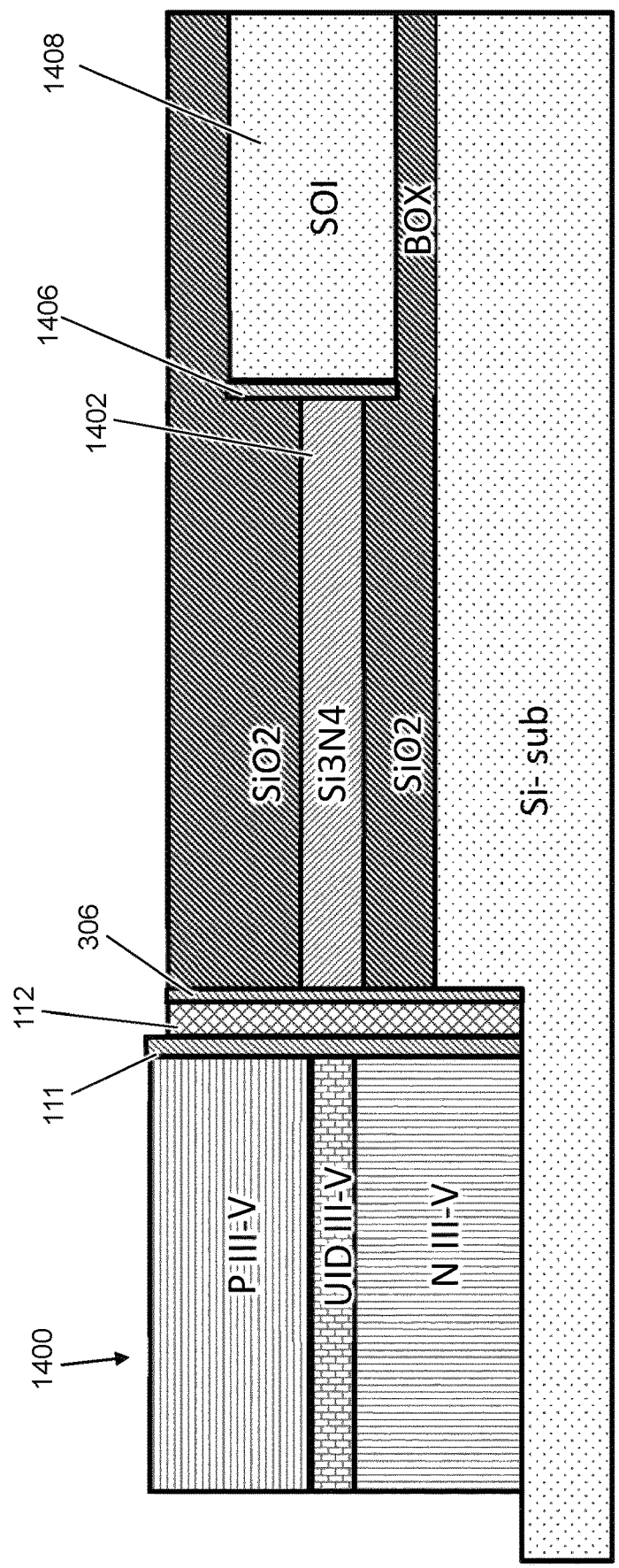
FIG. 16 shows a section view of a variant optoelectronic device according to an embodiment of the present invention.
Figure 17:
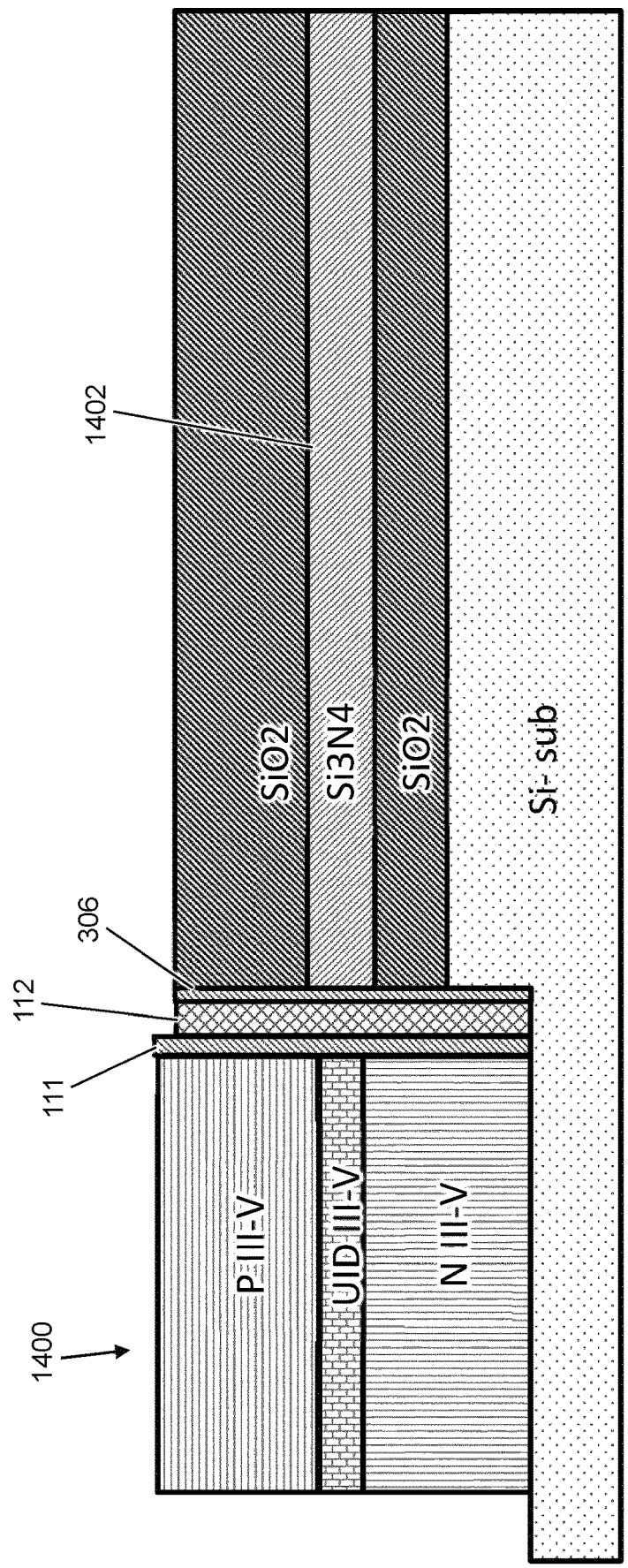
FIG. 17 shows a section view of a variant optoelectronic device according to an embodiment of the present invention.

FIG. 15 shows a section view of a variant optoelectronic device according to an embodiment of the present invention. It differs from the embodiment shown in FIG. 14 in that there is no silicon waveguide formed in a silicon device layer. Instead the photonic component only couples to silicon nitride waveguide 1402. FIG. 16 shows a section view of a variant according to an embodiment of the present invention. It differs from the embodiment shown in FIG. 14 in that the silicon nitride waveguide 1402 does not contain a Bragg grating. FIG. 17 shows a variant optoelectronic device according to an embodiment of the present invention. It differs from the embodiment shown in FIG. 14 in that it does not include a silicon waveguide formed in a silicon device layer and it does not include a Bragg grating in the silicon nitride waveguide 1402.

Figure 18:
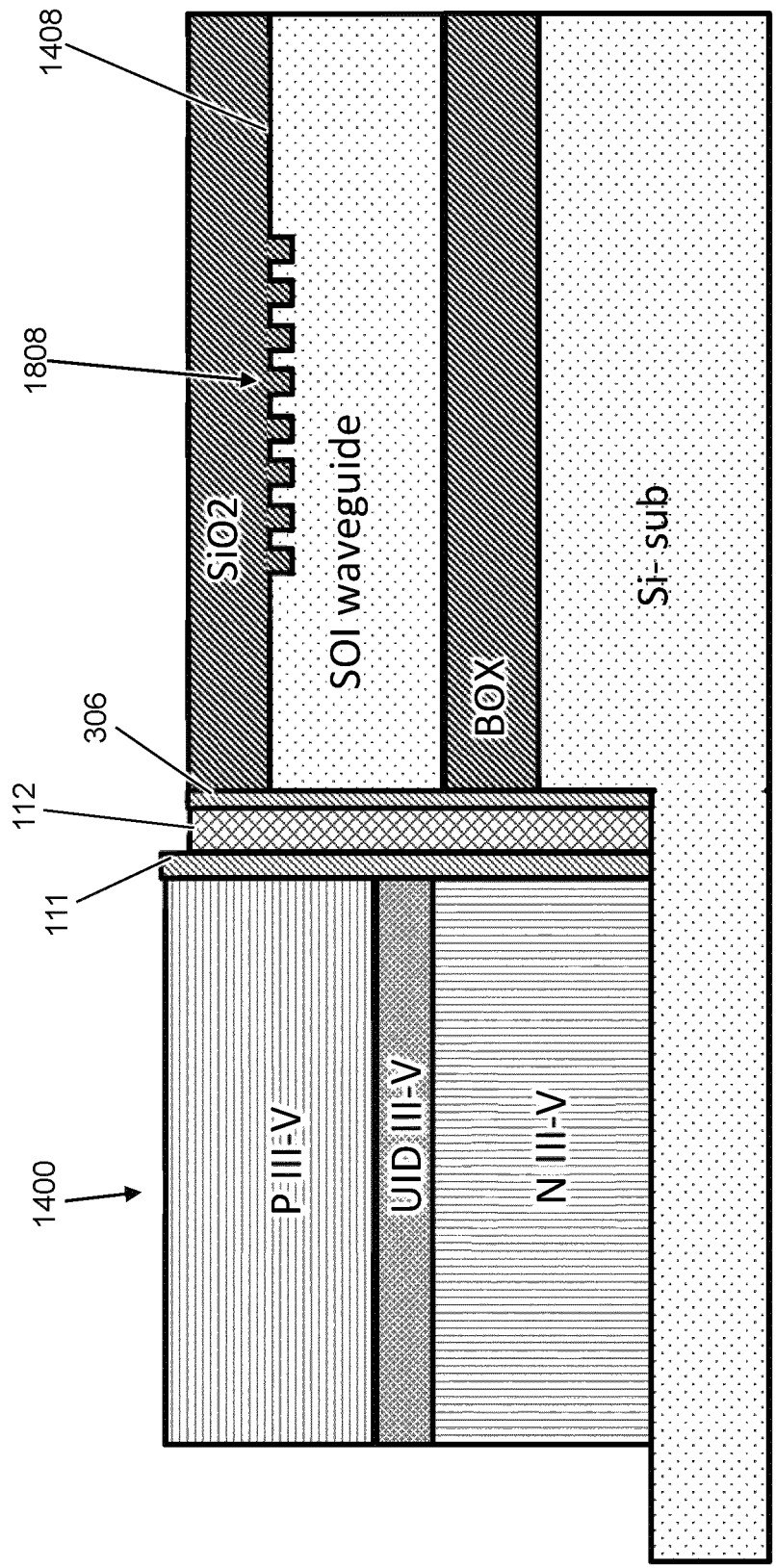
FIG. 18 shows a section view of a variant optoelectronic device according to an embodiment of the present invention.
Figure 19:
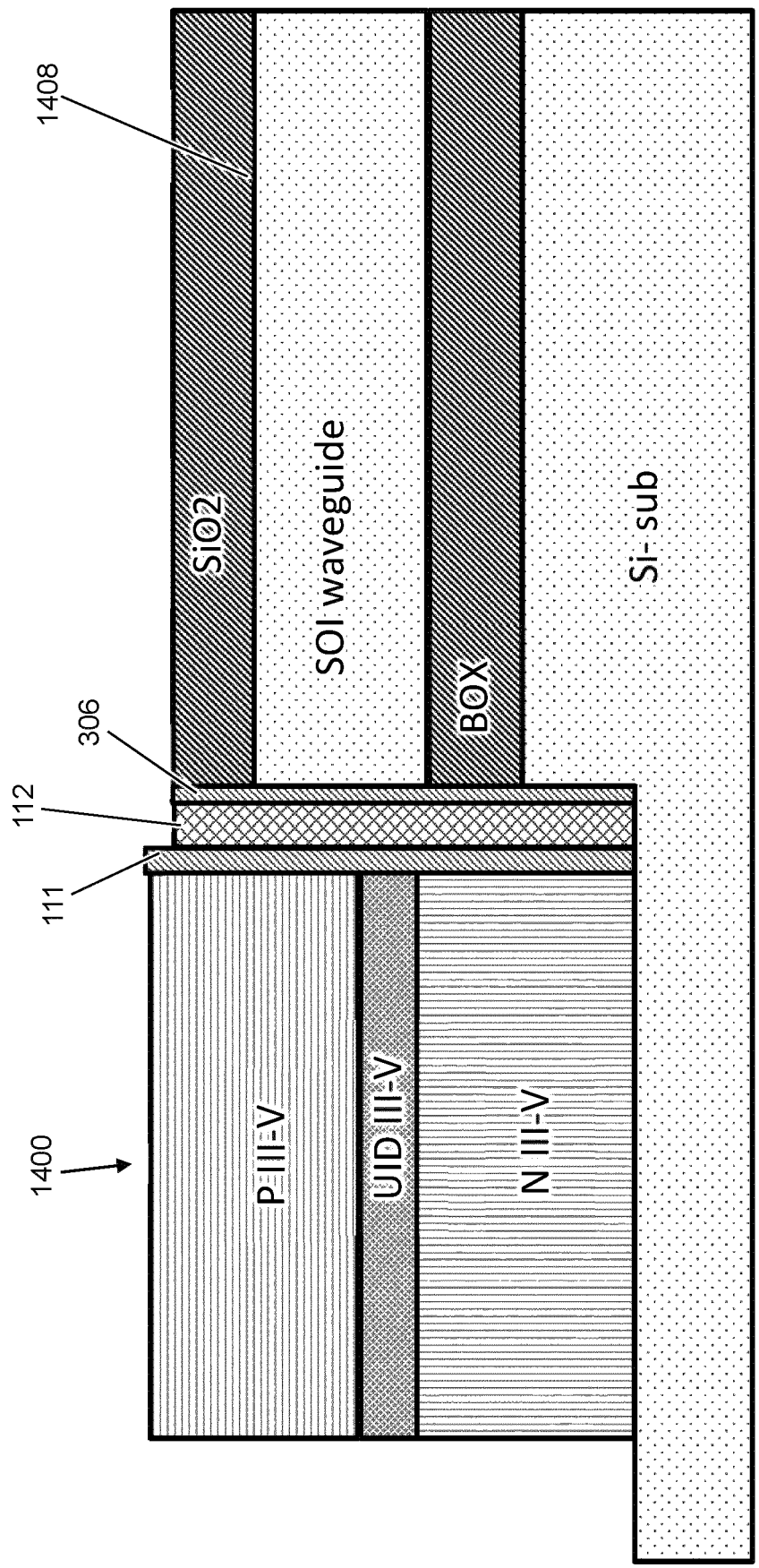
FIG. 19 shows a section view of a variant optoelectronic device according to an embodiment of the present invention.

FIG. 18 shows a section view of a variant optoelectronic device according to an embodiment of the present invention. A photonic component 1400, of the type discussed previously, has been bonded to a bed of a cavity formed in silicon substrate SI-sub of a silicon platform. The silicon platform includes a silicon waveguide 1408 formed in a silicon on insulator layer, and the silicon waveguide 1408 includes a Bragg grating 1808. The silicon waveguide is coupled to the photonic component via antireflective coatings 111 and 306 as well as bridge fill 112. FIG. 19 shows a schematic view of a variant optoelectronic device according to an embodiment of the present invention. It differs from the embodiment shown in FIG. 18 in that the silicon waveguide 1408 does not contain a Bragg grating.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

| List of Features | |
| --- | --- |
| 101, 202 | Silicon platform |
| 102 | III-V semiconductor based waveguide |
| 103a/b | Silicon waveguide |
| 104 | Waveguide interface |
| 105a/b | Contact pads |
| 106, 206 | III-V device coupon |
| 110 | III-V semiconductor based photonic component |
| 111 | Anti-reflective coating |
| 112 | Bridge fill |
| 113 | 1800 nm silicon waveguide portion |
| 114 | Cladding layer |
| 115 | 3000 nm silicon waveguide portion |
| 116 | Buried oxide layer |
| 117 | Silicon substrate |
| 201a/b | Contact pads |
| 301 | Multiple quantum well (QMW) layer |
| 302 | First silicon dioxide liner |
| 304 | Second silicon dioxide liner |
| 305 | BCB bridge fill |
| 306 | Second silicon nitride liner |
| 307 | Silicon substrate portion |
| 102a | III-V waveguide ridge |
| 102b | III-V waveguide slab |
| 701-706 | III-V semiconductor layers |
| 707 | Photoresist tether |
| 801 | BCB fill |
| 805a/b | Electrode trace |
| 901 | Silicon on insulator/device layer |
| 902 | First cavity |
| 903 | Bonding cavity |
| 904 | Adhesive |
| 905 | Stamp (elastomer) |
| 907 | Spun coated BCB |
| 1201 | EAM |
| 1202 | Laser |
| 1203 | SOA |
| 1301 | Output waveguide |
| 1400 | Photonic component |
| 1402 | SiN3 waveguide |
| 1404 | SiN Grating |
| 1408 | SOI waveguide |
| 1808 | Si Grating |

The invention claimed is:

1. A method of manufacturing an optoelectronic device, the manufactured device including a photonic component coupled to a waveguide, the method comprising:
providing a device coupon, the device coupon including the photonic component;
providing a platform comprising a wafer, the wafer comprising a substrate, a buried oxide (BOX) layer on the substrate, and a semiconductor device layer on the BOX layer, the wafer having a cavity extending through the semiconductor device layer, and a bonding surface for the device coupon being within the cavity;
transfer printing the device coupon onto the cavity, such that a surface of the device coupon directly abuts the bonding surface and at least one channel is present between the device coupon and a sidewall of the cavity; and
filling the at least one channel with a filling material via a spin-coating process, to form a bridge coupling the photonic component to the waveguide.

2. The method of claim 1, further comprising a step of curing the filling material after it has been spun-coated.

3. The method of claim 1, wherein the device coupon includes a first and second electrode.

4. The method of claim 1, wherein the wafer is a silicon-on-insulator wafer and a silicon waveguide is in the semiconductor device layer, the silicon waveguide directly abutting the cavity.

5. The method of claim 4, wherein the silicon waveguide includes a waveguide tapering in height in a direction towards the cavity, from a first height to a second height, the first height being greater than the second height.

6. The method of claim 4, wherein the silicon waveguide includes a T-bar end portion, positioned adjacent to the cavity.

7. The method of claim 4, wherein the silicon waveguide includes a Bragg grating.

8. The method of claim 1, wherein the platform has a silicon nitride waveguide.

9. The method of claim 8, wherein the silicon nitride waveguide includes a Bragg grating.

10. The method of claim 1, wherein the photonic component is made of III-V materials.

11. The method of claim 1, wherein the photonic component is made of II-VI materials.

12. The method of claim 1, wherein the photonic component is made of group IV materials.

13. The method of claim 1, wherein the photonic component comprises regular quantum wells.

14. The method of claim 1, wherein the photonic component comprises triangle quantum wells.

15. The method of claim 1, wherein the photonic component is a photodetector.

16. The method of claim 1, wherein the photonic component is an electro-absorption modulator, EAM, utilising the quantum confined stark effect, QCSE.

17. The method of claim 1, wherein the photonic component is an electro-absorption modulator, EAM, utilising the Franz-Keldysh, FK effect.

18. The method of claim 1, wherein the photonic component includes a U-shaped waveguide, and the platform includes two waveguides, each coupled to a respective leg of the U-shaped waveguide.

19. The method of claim 1, further including a step, before filling the channel, of lining one or more sidewalls of the cavity with an anti-reflective liner.

* * * * *